(12) United States Patent
Wei et al.

(10) Patent No.: US 9,390,979 B2
(45) Date of Patent: Jul. 12, 2016

(54) OPPOSITE POLARITY BORDERLESS REPLACEMENT METAL CONTACT SCHEME

(71) Applicant: GLOBALFOUNDRIES Inc., Grand Cayman (KY)

(72) Inventors: Andy Chih-Hung Wei, Queensbury, NY (US); Guillaume Bouche, Albany, NY (US); Huy M. Cao, Rexford, NY (US); Jing Wan, Malta, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 34 days.

(21) Appl. No.: 14/482,529

(22) Filed: Sep. 10, 2014

(65) Prior Publication Data

US 2016/0071774 A1    Mar. 10, 2016

(51) Int. Cl.
*H01L 21/8234* (2006.01)
*H01L 21/308* (2006.01)
*H01L 21/311* (2006.01)
*H01L 27/088* (2006.01)
*H01L 21/768* (2006.01)

(52) U.S. Cl.
CPC .... *H01L 21/823475* (2013.01); *H01L 21/3081* (2013.01); *H01L 21/3085* (2013.01); *H01L 21/3086* (2013.01); *H01L 21/31111* (2013.01); *H01L 21/76801* (2013.01); *H01L 21/76802* (2013.01); *H01L 21/76808* (2013.01); *H01L 21/76877* (2013.01); *H01L 21/76897* (2013.01); *H01L 21/823437* (2013.01); *H01L 27/088* (2013.01)

(58) Field of Classification Search
CPC ................ H01L 21/823475; H01L 21/76801; H01L 21/76802; H01L 21/76808; H01L 21/76877; H01L 21/76897; H01L 21/823871; H01L 21/3081

See application file for complete search history.

(56) References Cited

U.S. PATENT DOCUMENTS

| 8,796,783 B2 | 8/2014 | Fan et al. |
| 2006/0263985 A1* | 11/2006 | Kang .............. H01L 21/823814 438/275 |
| 2006/0284229 A1* | 12/2006 | Park .................. H01L 21/76816 257/304 |
| 2012/0098070 A1* | 4/2012 | Wang ................ H01L 21/76834 257/368 |
| 2012/0175709 A1* | 7/2012 | Cho ................ H01L 21/823425 257/369 |
| 2012/0217588 A1 | 8/2012 | Vega |
| 2013/0168749 A1* | 7/2013 | Fan ................ H01L 21/823418 257/288 |
| 2013/0178035 A1 | 7/2013 | Vega |
| 2013/0309852 A1* | 11/2013 | Kanakasabapathy H01L 21/28008 438/585 |

* cited by examiner

*Primary Examiner* — Joseph C Nicely
(74) *Attorney, Agent, or Firm* — Williams Morgan, P.C.

(57) ABSTRACT

An improved semiconductor structure and methods of fabrication that provide improved transistor contacts in a semiconductor structure are provided. A set of masks is formed over a portion of the semiconductor structure. Each mask in this set of masks covers at least one source/drain (s/d) contact location. An oxide layer is removed from remainder portions of the semiconductor structure that are not covered by the set of masks. Then an opposite-mask fill layer is formed in the remainder portions from which the oxide layer was removed. The oxide layer is then removed from the remainder of the semiconductor structure, i.e., the portion previously covered by the set of masks and contacts are formed to the at least s/d contact location in the recesses formed by the removal of the remainder of the oxide layer.

14 Claims, 21 Drawing Sheets

US 9,390,979 B2

OPPOSITE POLARITY BORDERLESS REPLACEMENT METAL CONTACT SCHEME

FIELD OF THE INVENTION

The present invention relates generally to semiconductor fabrication, and more particularly, to structures for transistor contacts and methods of fabrication.

BACKGROUND

As technology progresses, the manufacture of electronic devices must be improved to meet the trend of mobile, lightweight, and efficient electronic devices. In addition to reducing the size of the semiconductor devices, miniaturization can also be achieved by reducing the distance between semiconductor devices. However, process problems remain that limit the amount of miniaturization that can be achieved. In particular, the contacts which interface the devices to metallization layers can pose numerous challenges. It is therefore desirable to have improved contacts and methods of fabrication.

SUMMARY

Embodiments of the present invention provide an improved semiconductor structure and methods of fabrication that provide improved transistor contacts in a semiconductor structure. A set of masks is formed over a portion of the semiconductor structure. Each mask in this set of masks covers at least one source/drain (s/d) contact location. An oxide layer is removed from remainder portions of the semiconductor structure that are not covered by the set of masks. Then an opposite-mask fill layer is formed in the remainder portions from which the oxide layer was removed. The oxide layer is then removed from the remainder of the semiconductor structure, i.e., the portion previously covered by the set of masks, and contacts are formed to the at least s/d contact location in the recesses formed by the removal of the remainder of the oxide layer.

In a first aspect, embodiments of the present invention provide a method of forming a set of contacts in a semiconductor structure comprising: forming a set of masks over a portion of the semiconductor structure, wherein each mask in the set of masks covers at least one source/drain (s/d) contact location; removing a oxide layer from remainder portions of the semiconductor structure that are not covered by the set of masks; forming an opposite-mask fill layer in the remainder portions of the semiconductor structure; removing the oxide layer from the portion of the semiconductor structure previously covered by the set of masks; and depositing a metal contact layer that forms a contact to the at least one s/d contact location in the portion of the semiconductor structure previously covered by the set of masks.

In a second aspect, embodiments of the present invention provide a method of forming a semiconductor device comprising: forming a set of source-drain (s/d) regions and a set of replacement metal gates on a substrate; forming a set of gate capping regions over the set of replacement metal gates; forming an oxide layer over the semiconductor device; forming a set of masks over a portion of the semiconductor device, wherein each mask in the set of masks covers at least one source/drain (s/d) contact location; removing the oxide layer from remainder portions of the semiconductor device that are not covered by the set of masks; forming a silicon oxycarbide dielectric layer in the remainder portions of the semiconductor device; removing the oxide layer from the portion of the semiconductor device previously covered by the set of masks; and depositing a metal contact layer that forms a contact to the at least one s/d contact location in the portion of the semiconductor device previously covered by the set of masks.

In a third aspect, embodiments of the present invention provide A semiconductor device, formed according to a method, comprising: forming a set of source-drain (s/d) regions and a set of replacement metal gates on a substrate; forming a set of gate capping regions over the set of replacement metal gates; forming an oxide layer over the semiconductor device; forming a set of masks over a portion of the semiconductor device, wherein each mask in the set of masks covers at least one source/drain (s/d) contact location; removing the oxide layer from remainder portions of the semiconductor device that are not covered by the set of masks; forming a silicon oxycarbide dielectric layer in the remainder portions of the semiconductor device; removing the oxide layer from the portion of the semiconductor device previously covered by the set of masks; and depositing a metal contact layer that forms a contact to the at least one s/d contact location in the portion of the semiconductor device previously covered by the set of masks.

BRIEF DESCRIPTION OF THE DRAWINGS

The accompanying drawings, which are incorporated in and constitute a part of this specification, illustrate several embodiments of the present teachings and, together with the description, serve to explain the principles of the present teachings.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1:
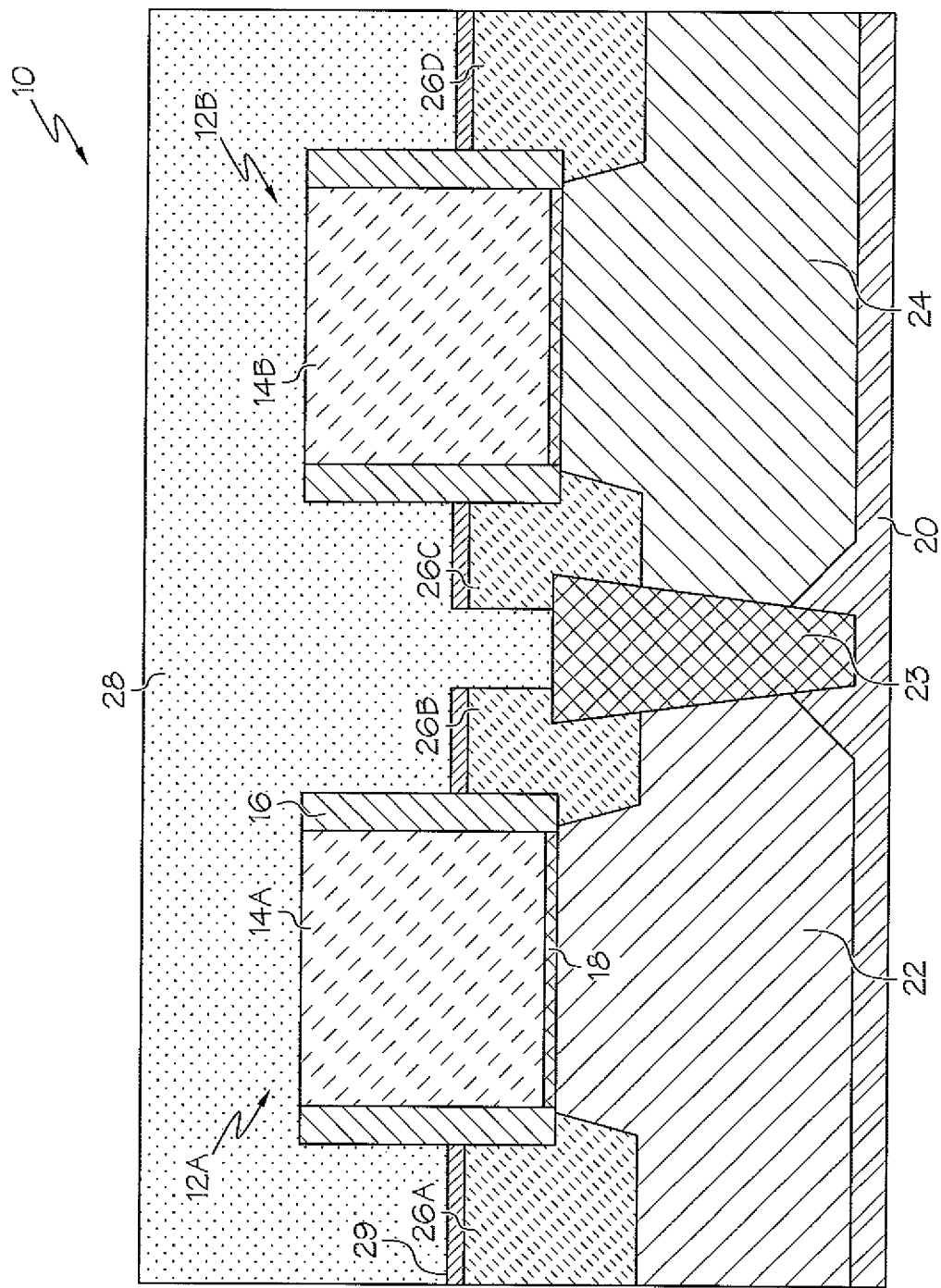
Figure 2:
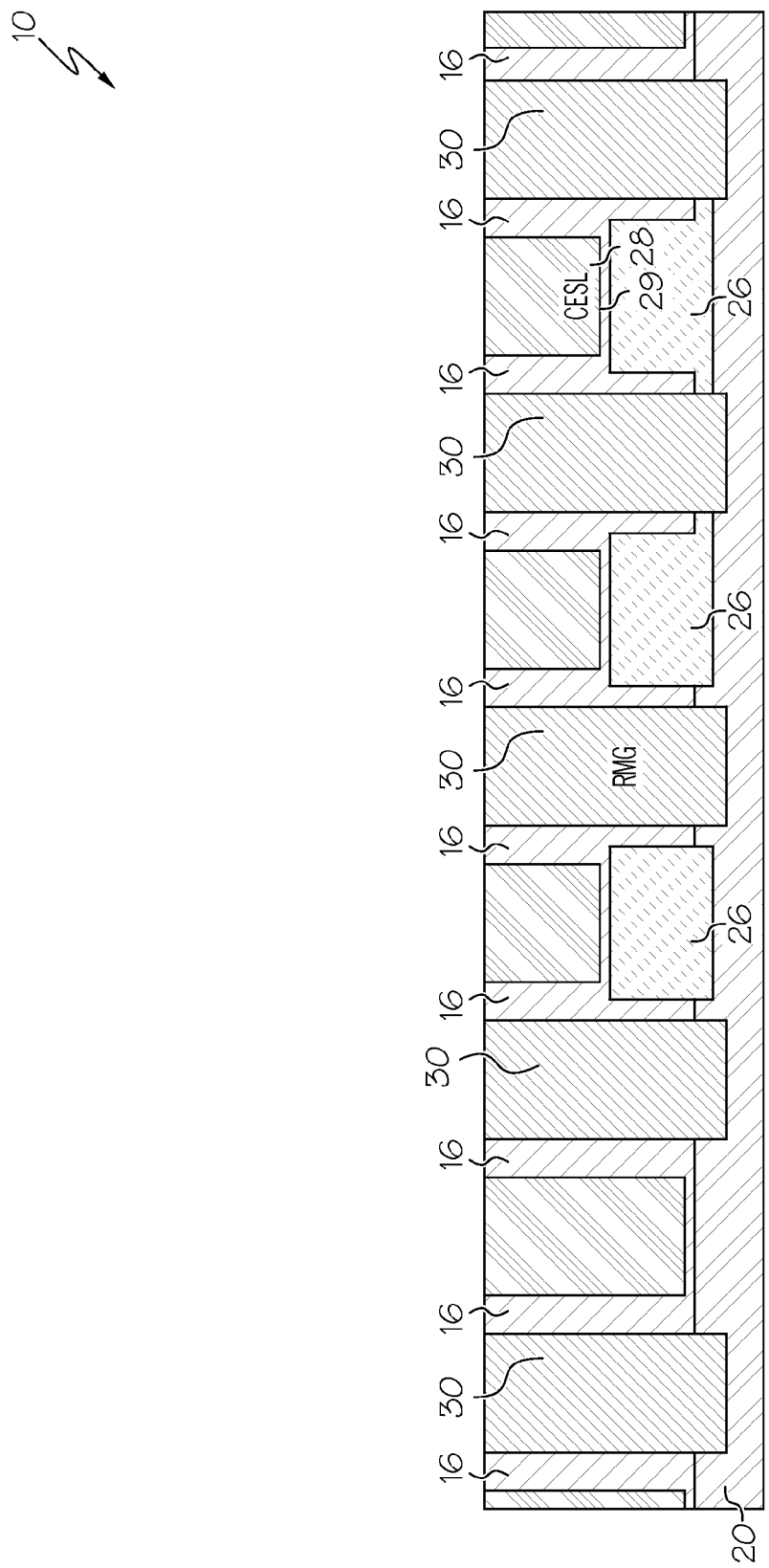
Figure 3:
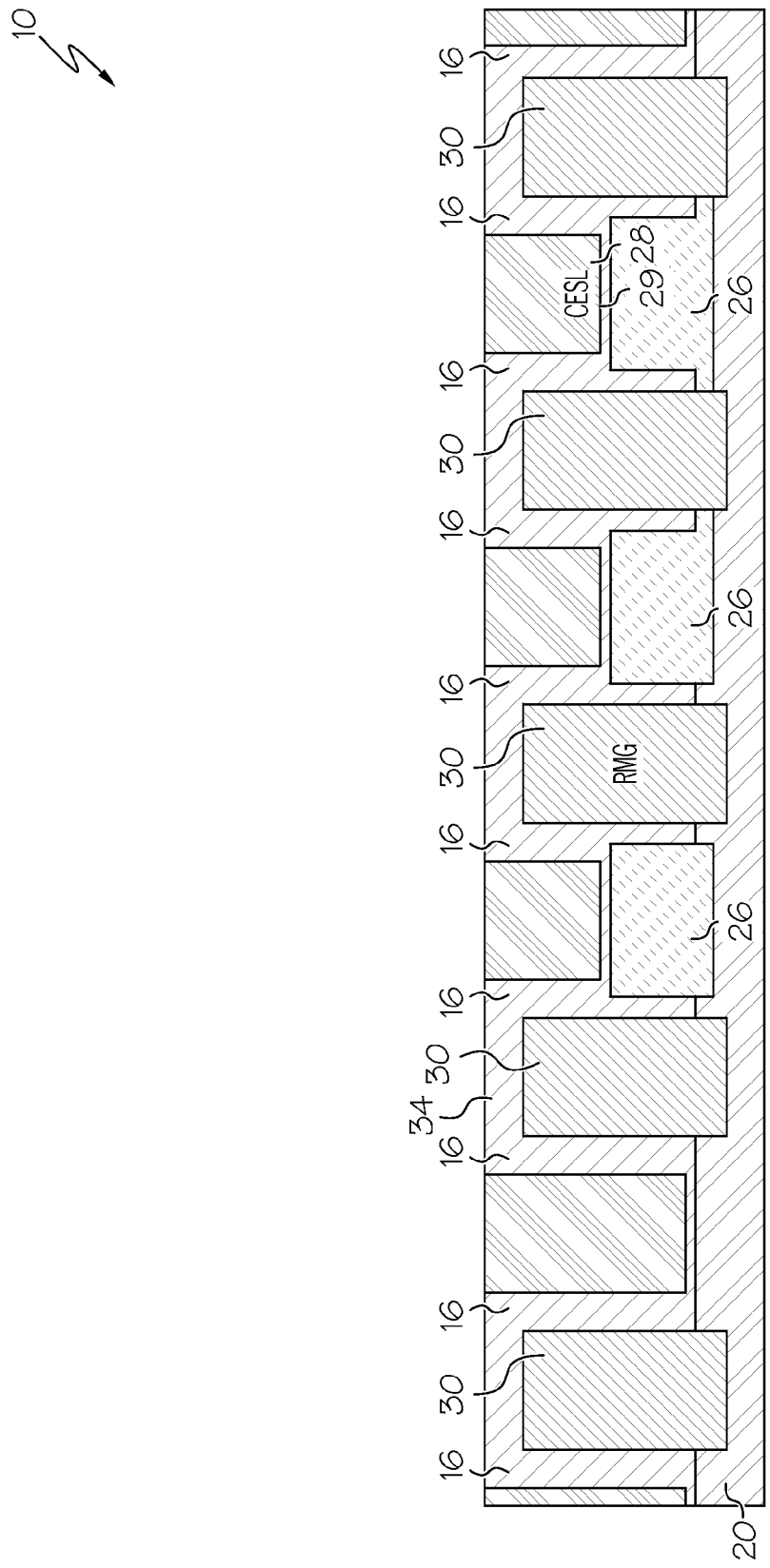
Figure 4:
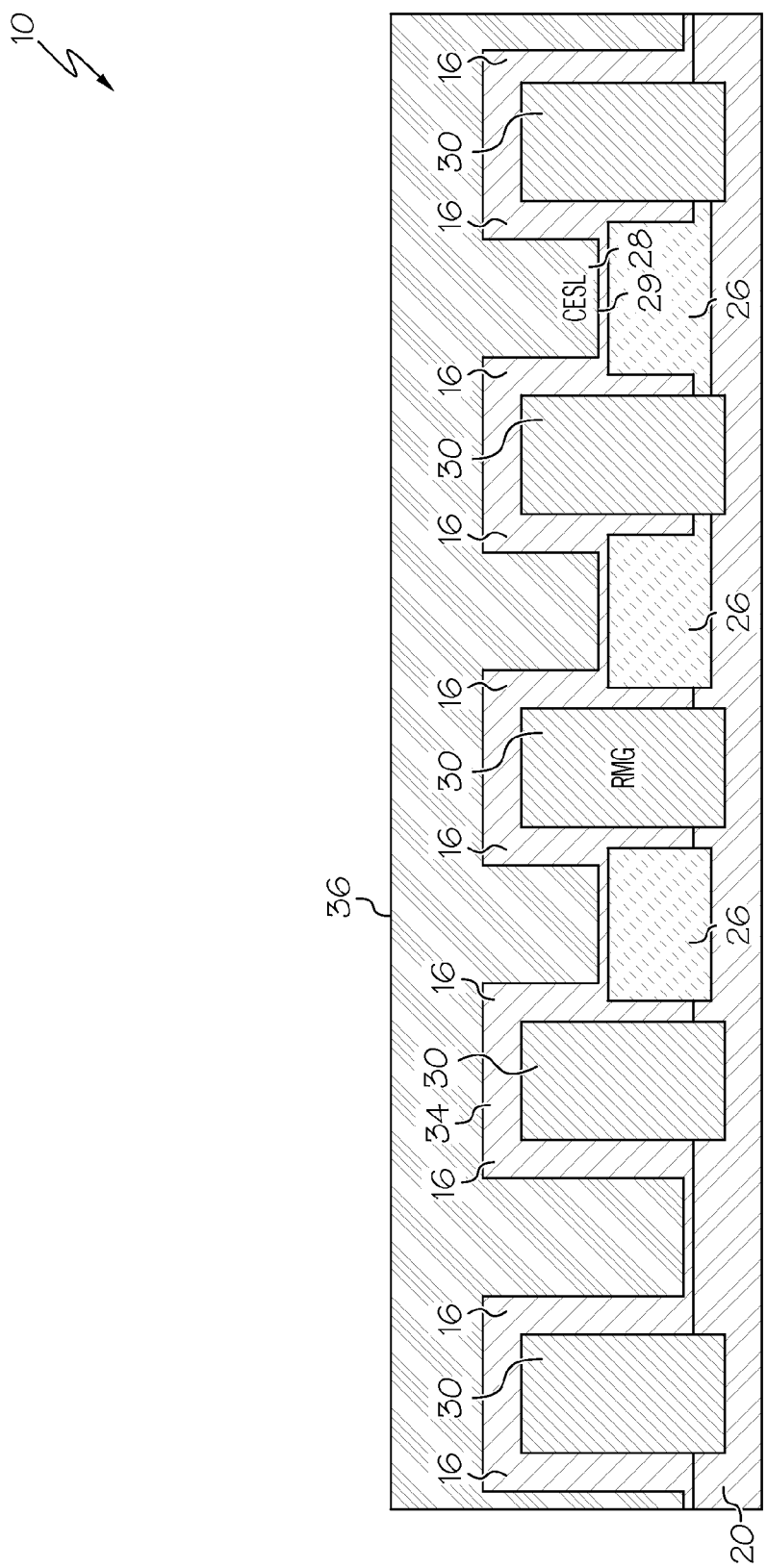
Figure 5:
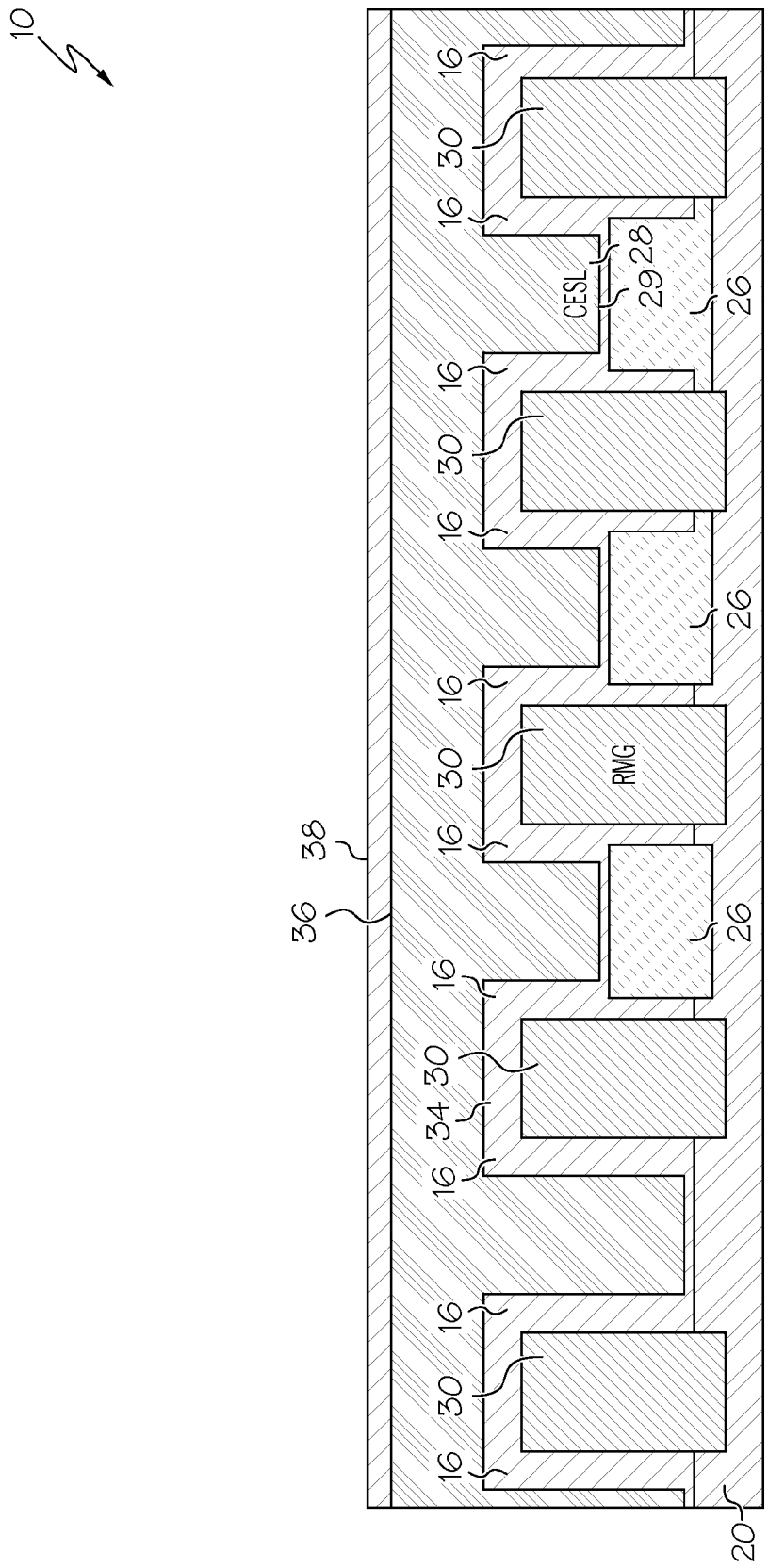
Figure 6:
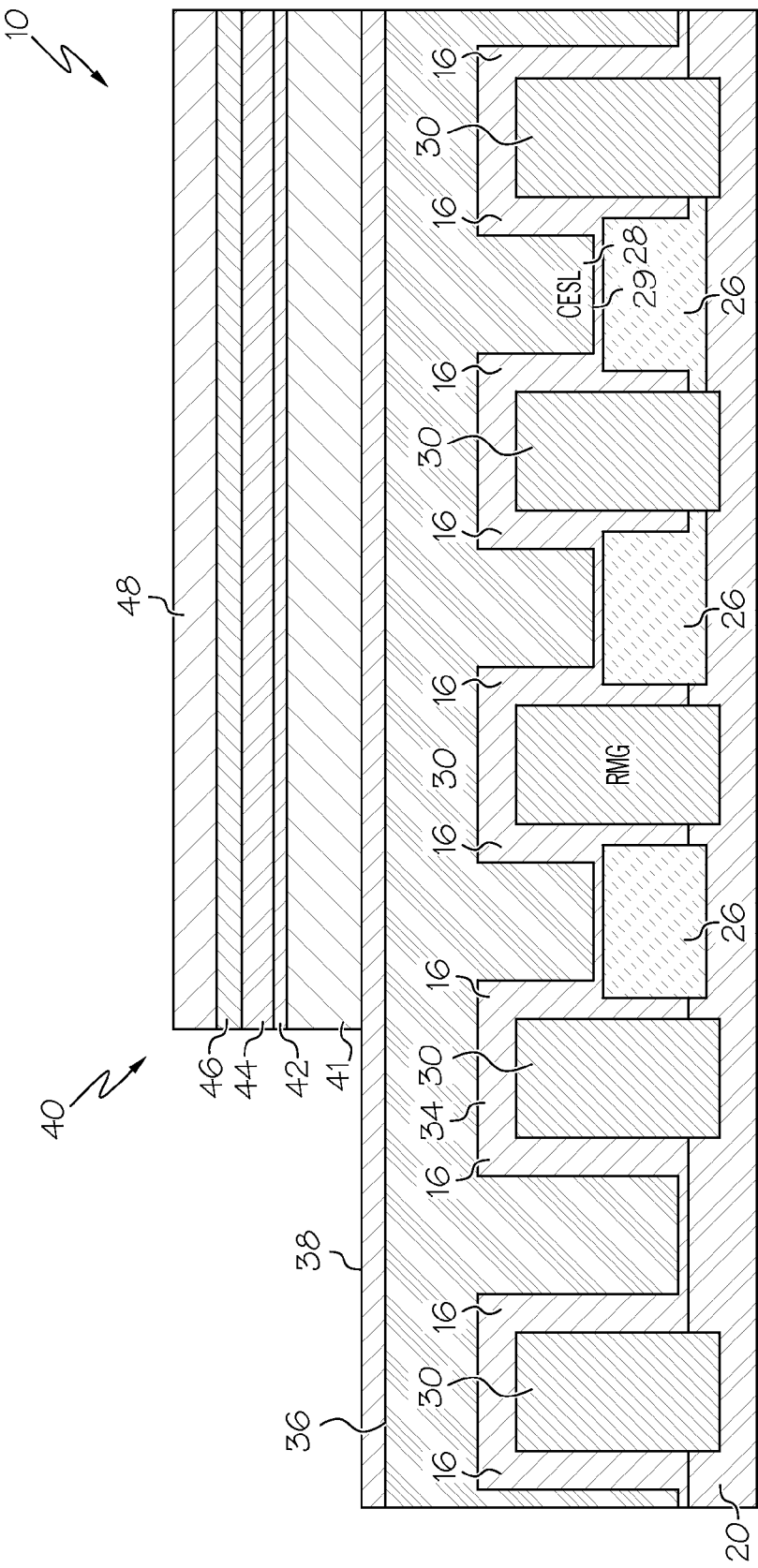
Figure 7:
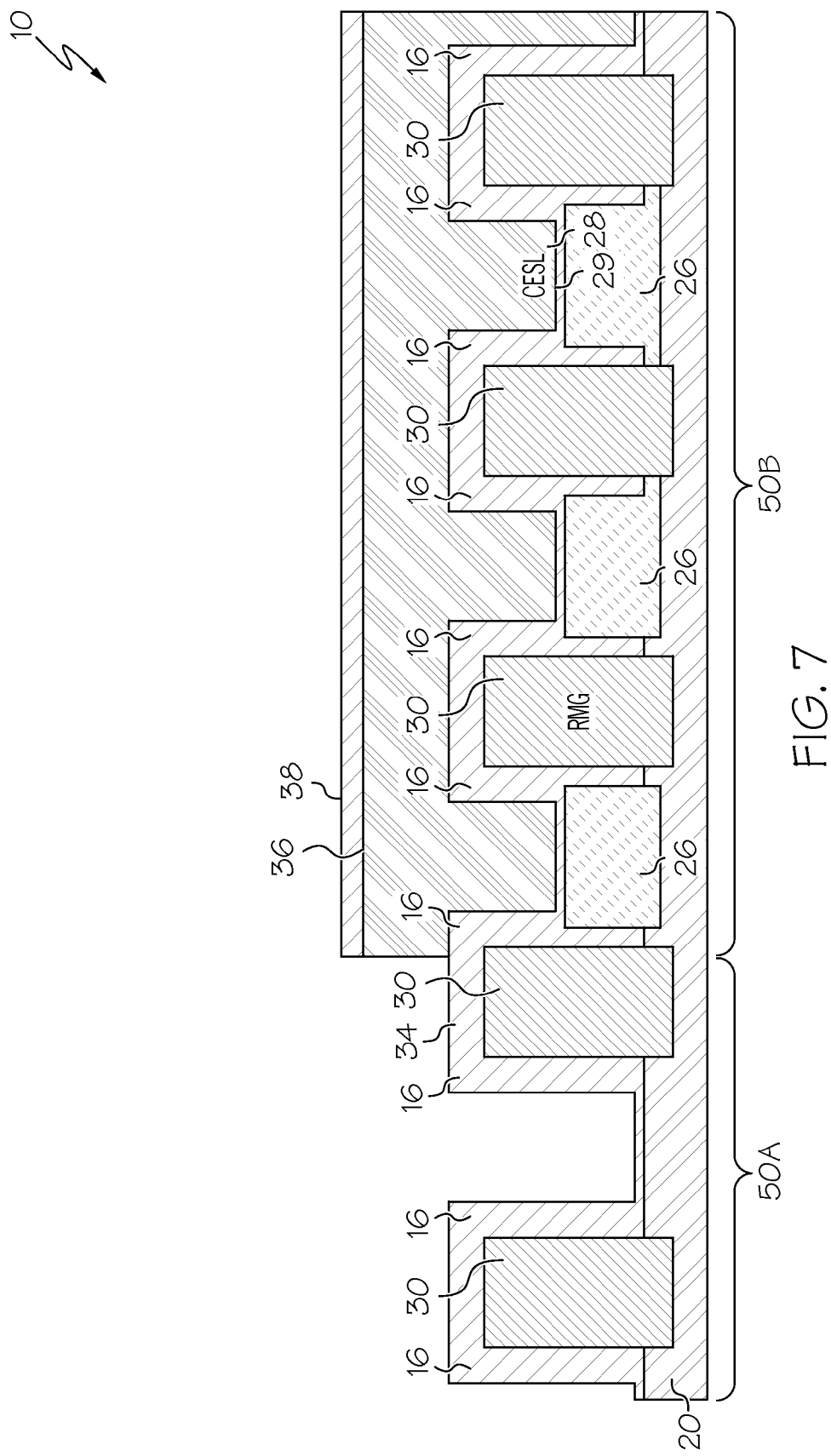
Figure 8:
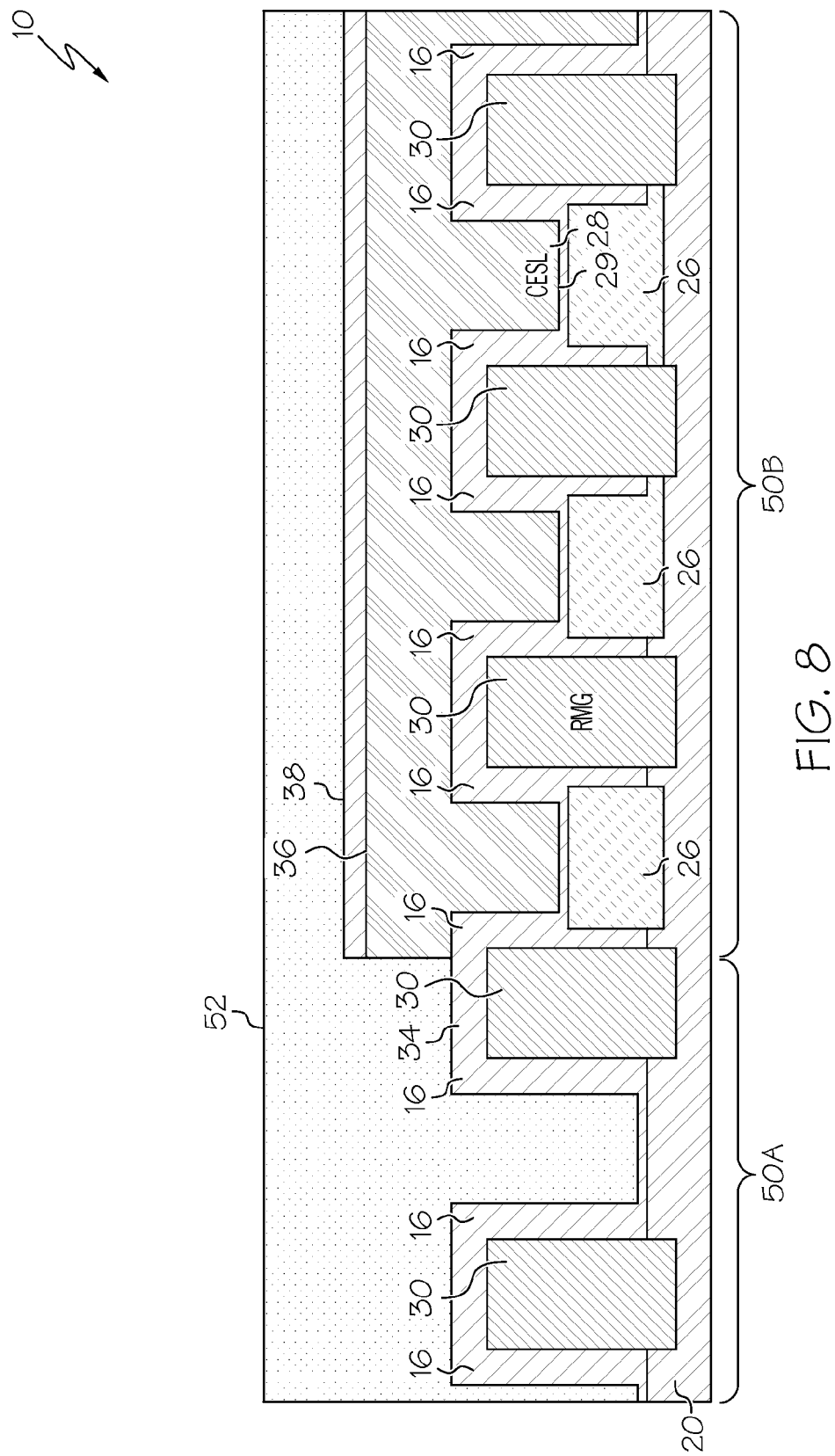
Figure 9:
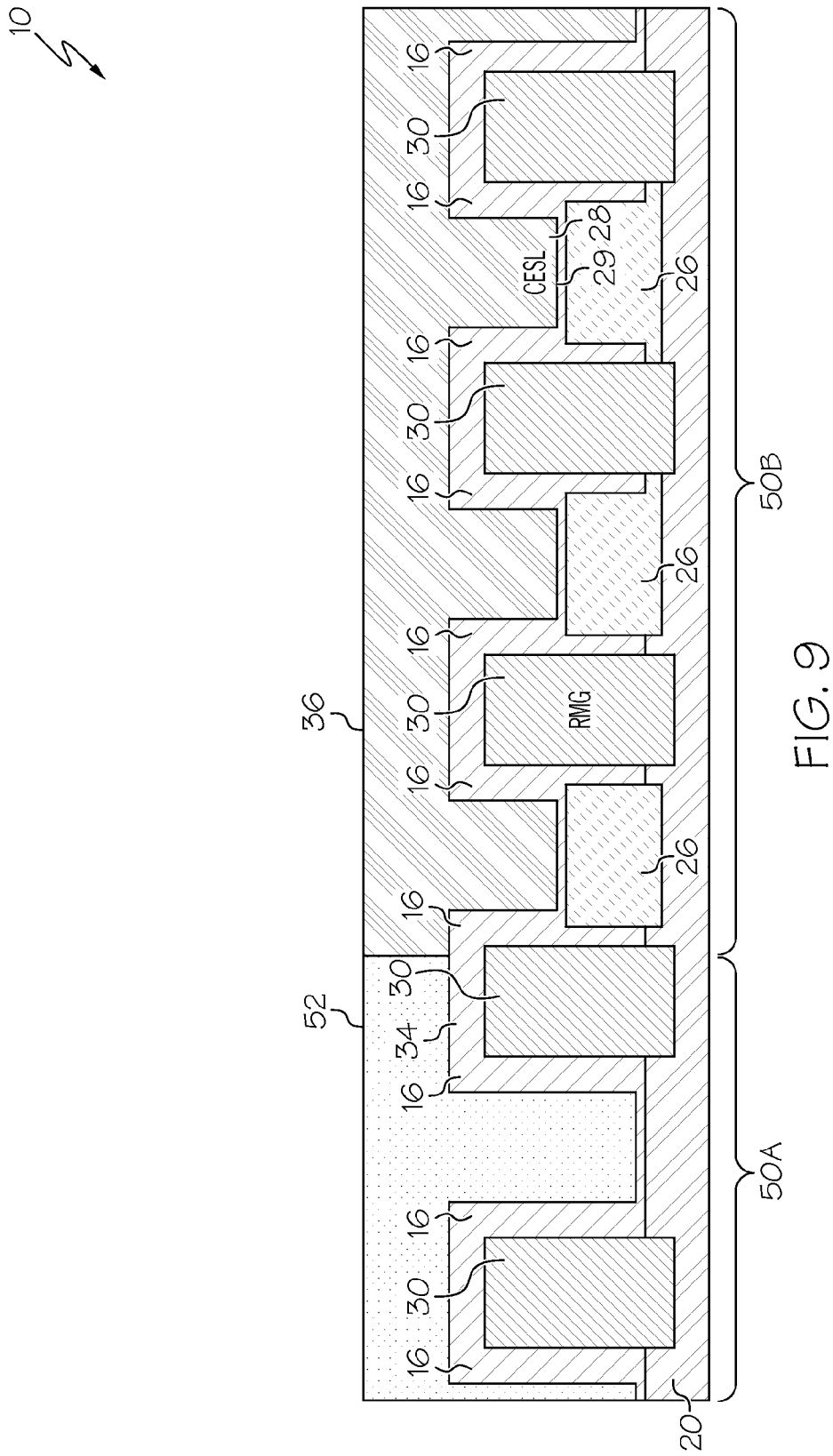
Figure 10:
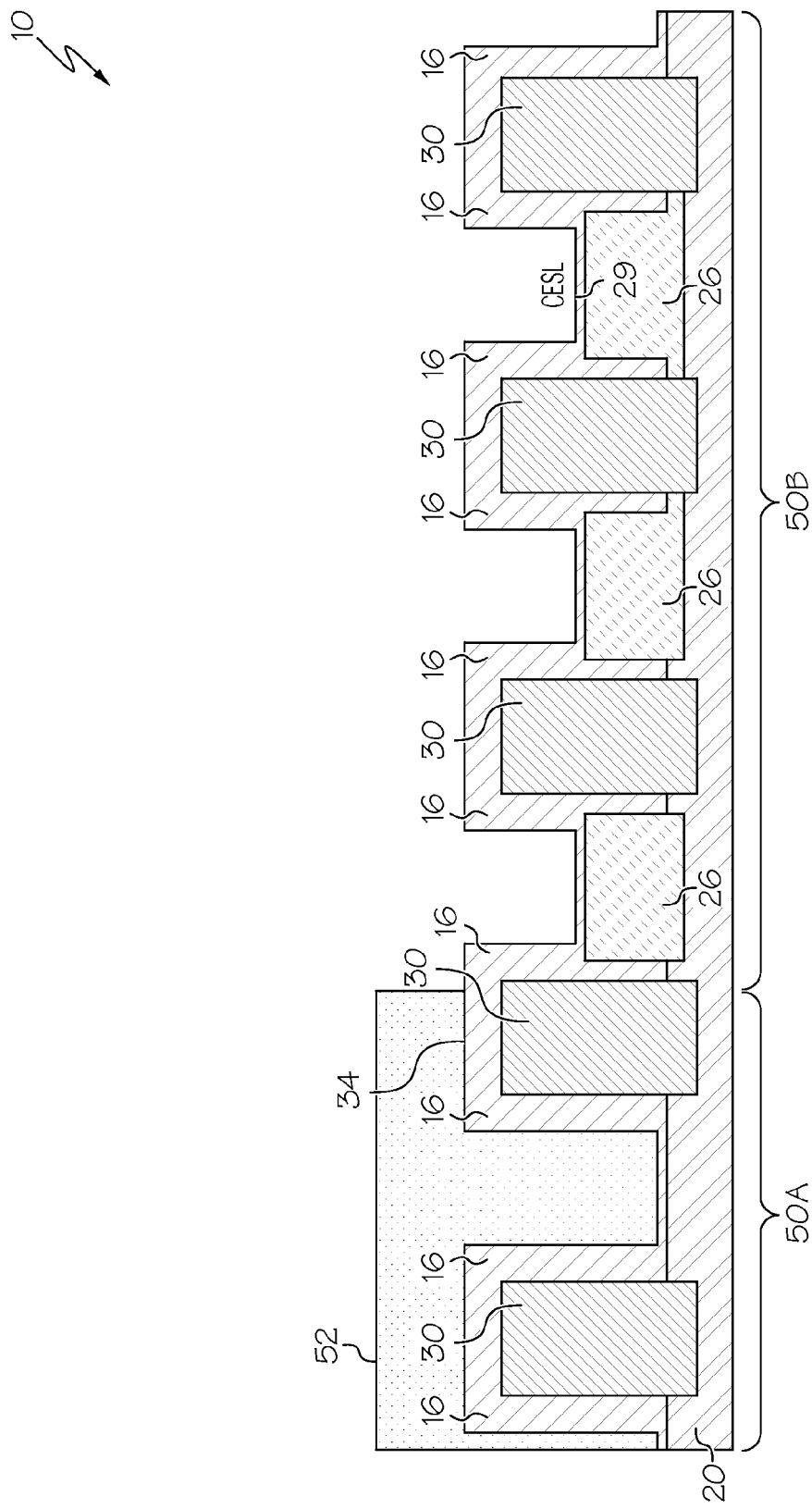
Figure 11:
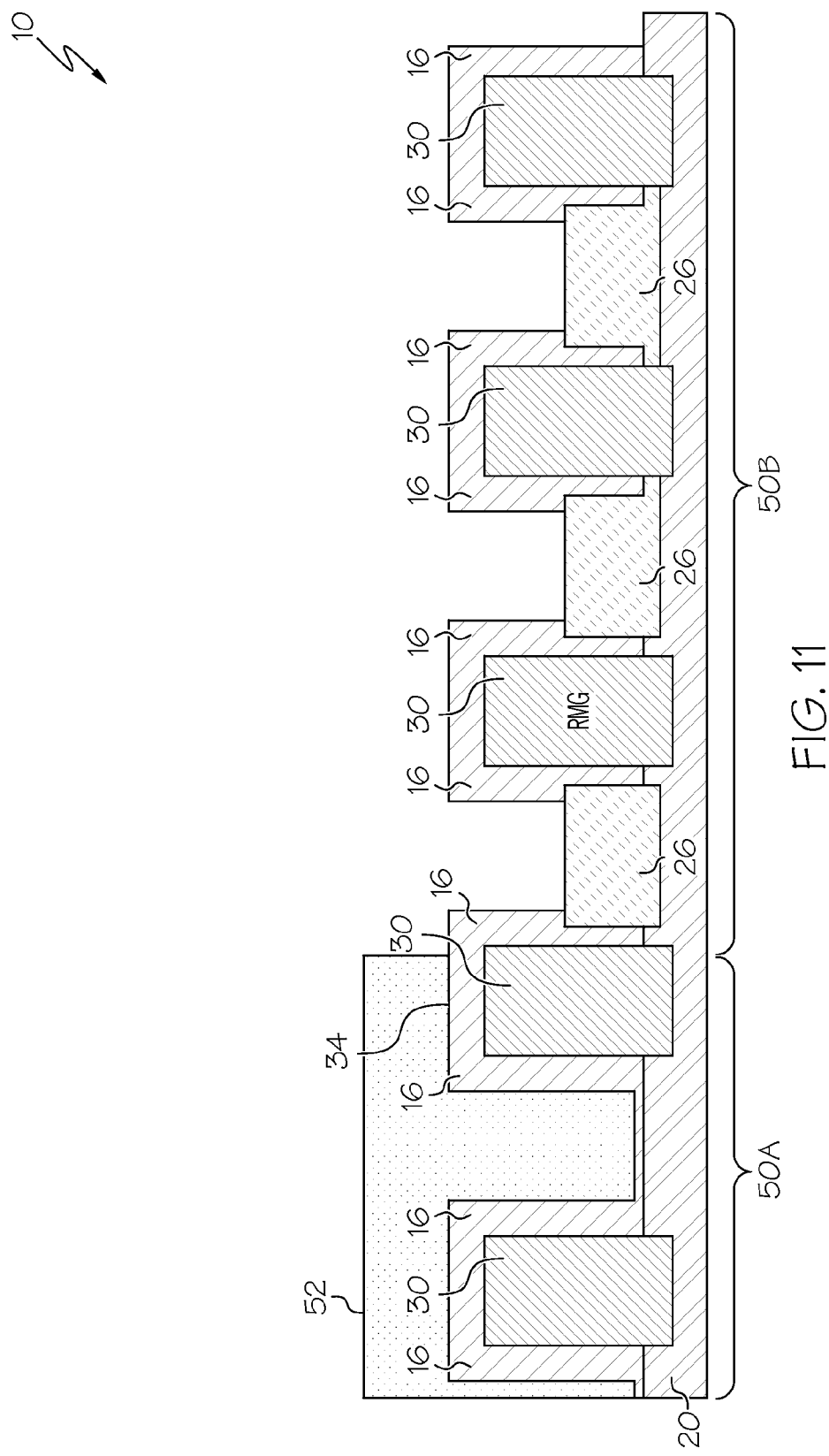
Figure 12:
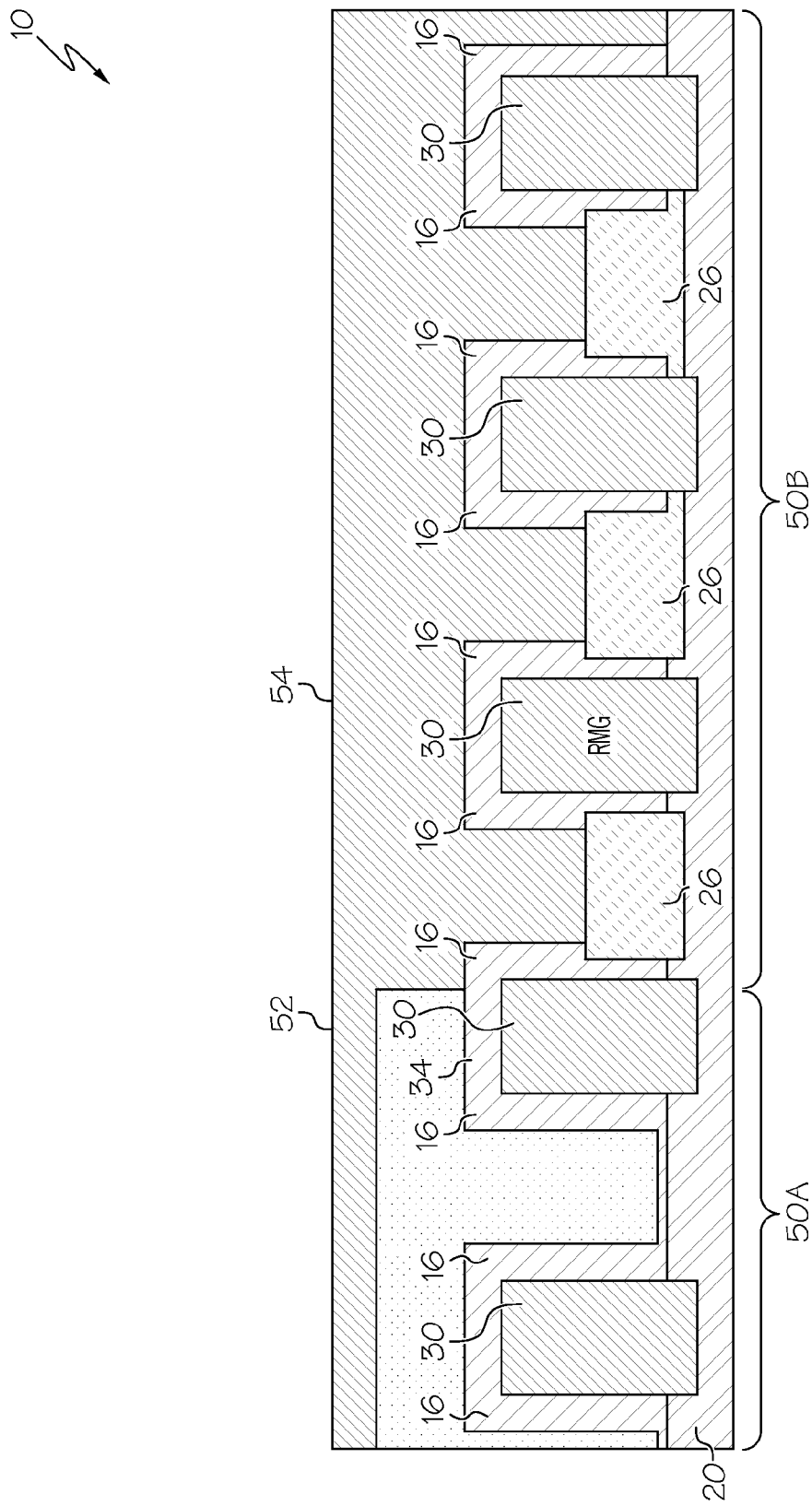
Figure 13:
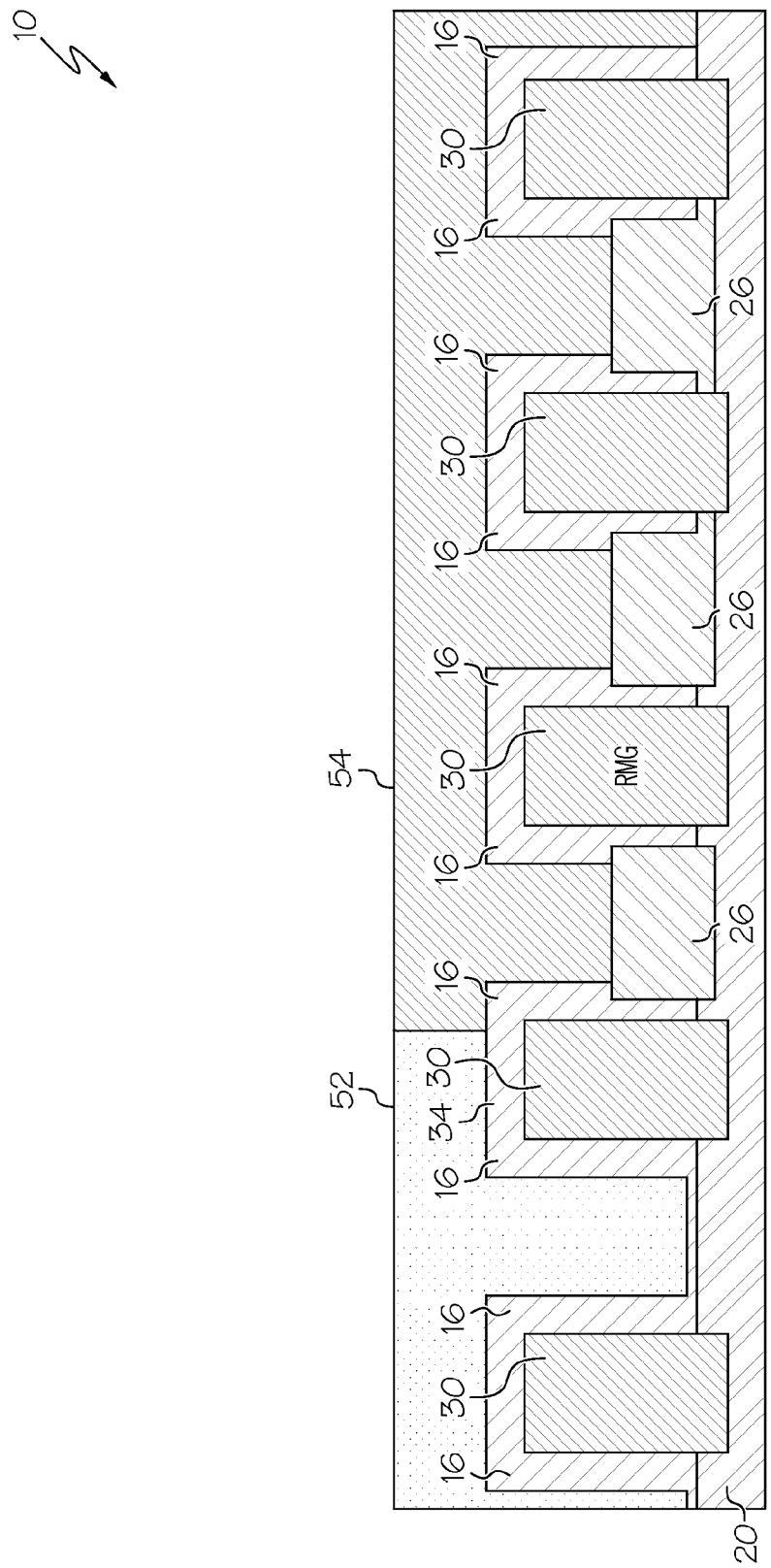
Figure 14:
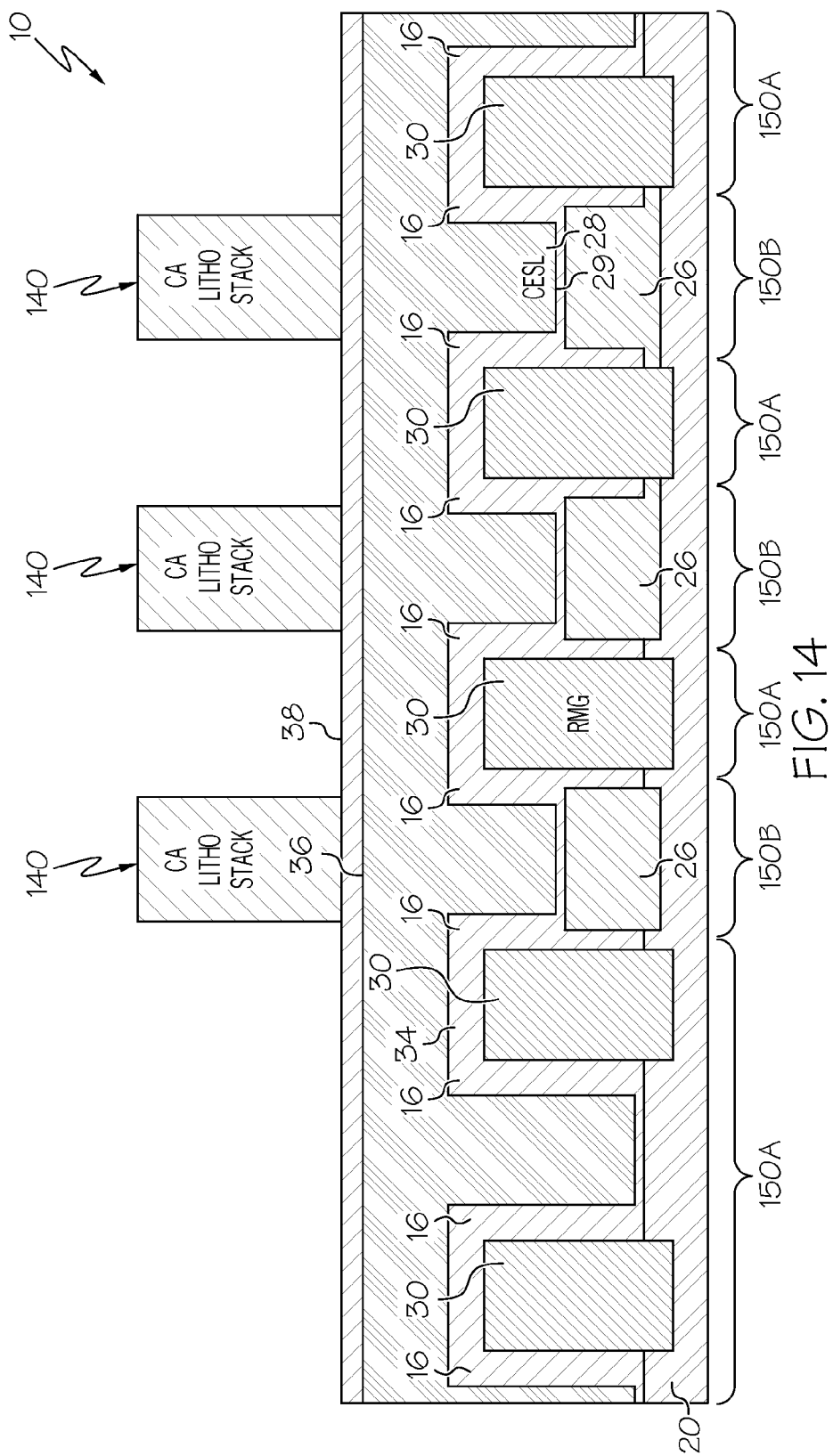
Figure 15:
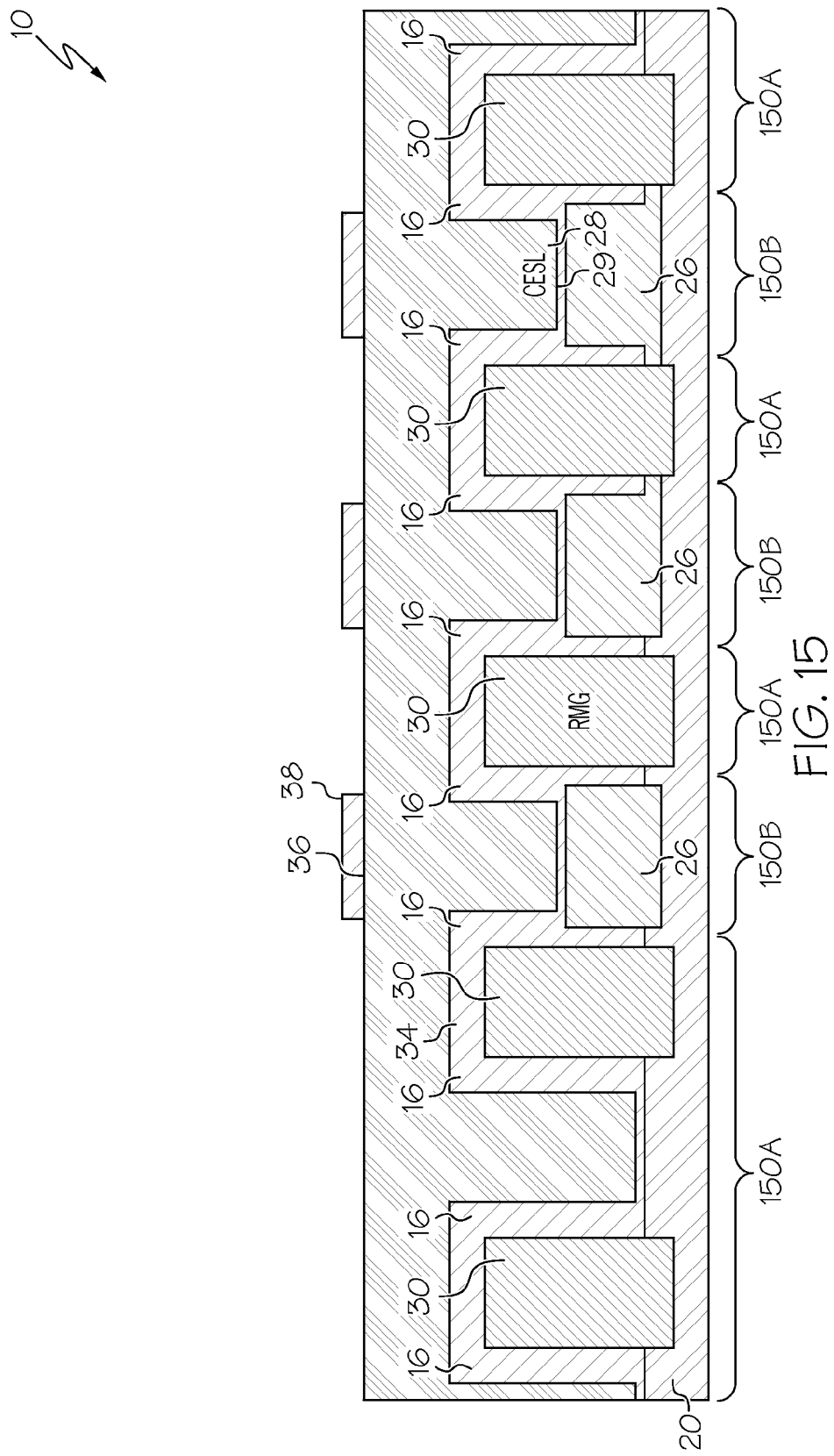
Figure 16:
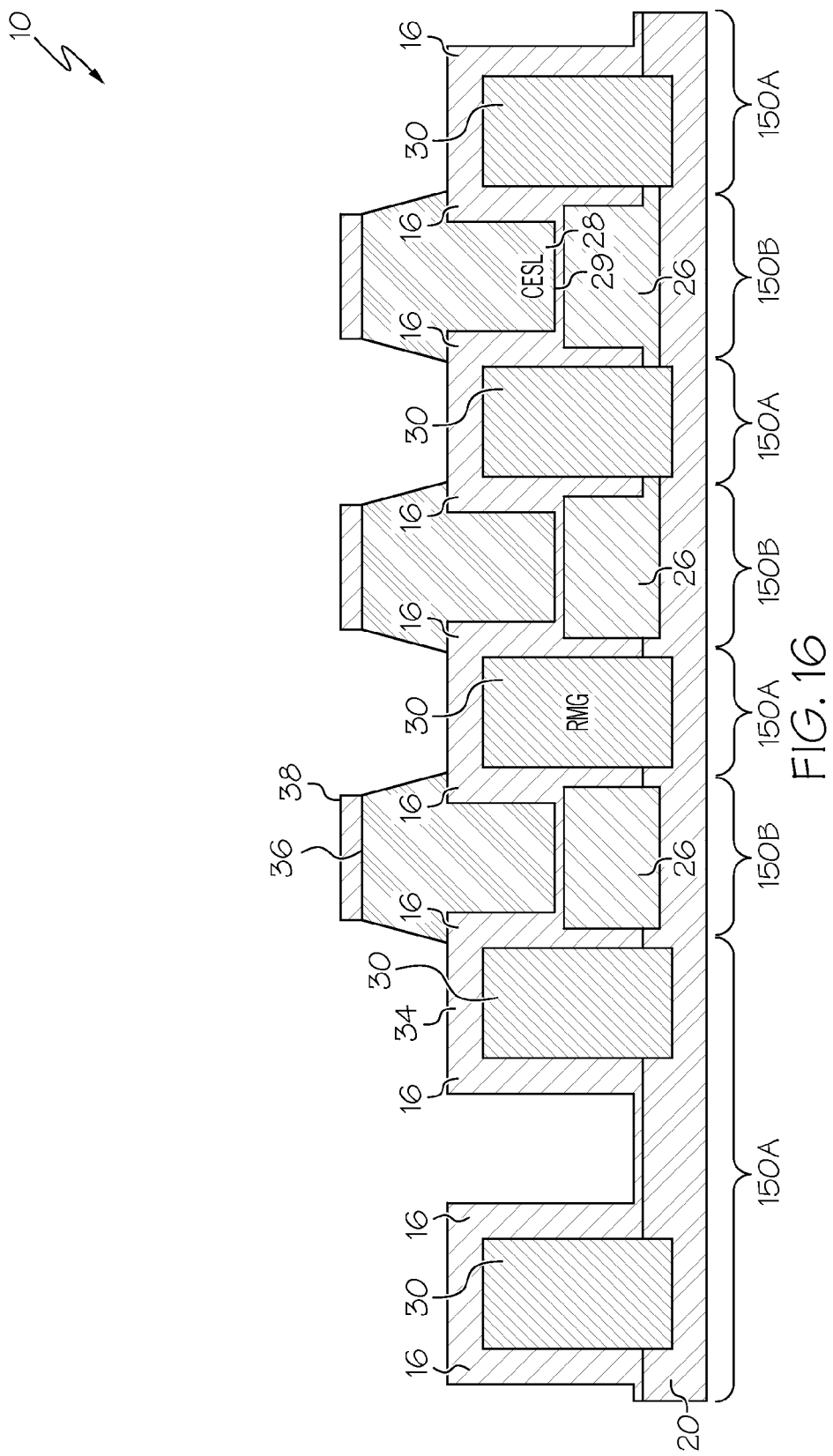
Figure 17:
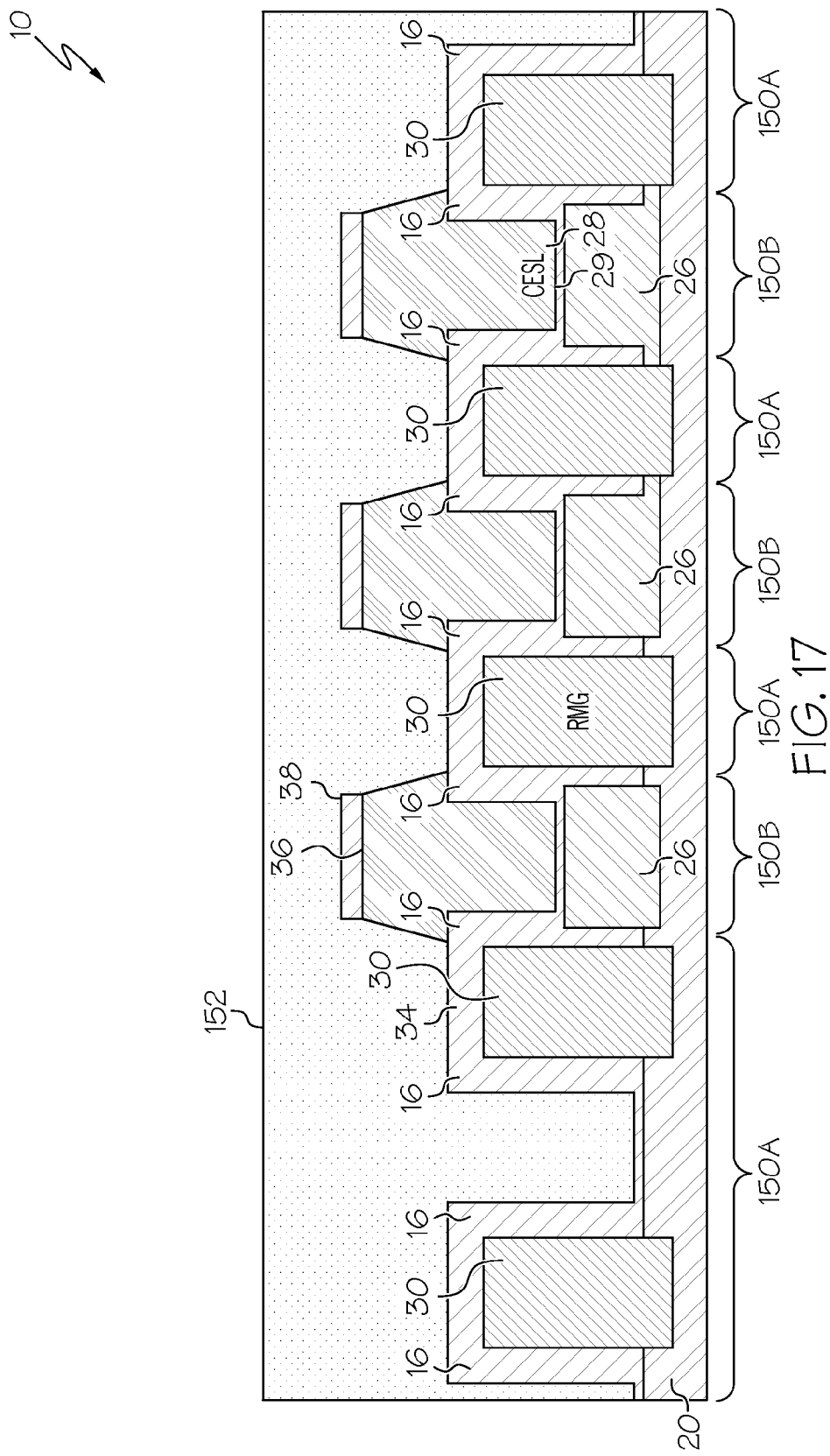
Figure 18:
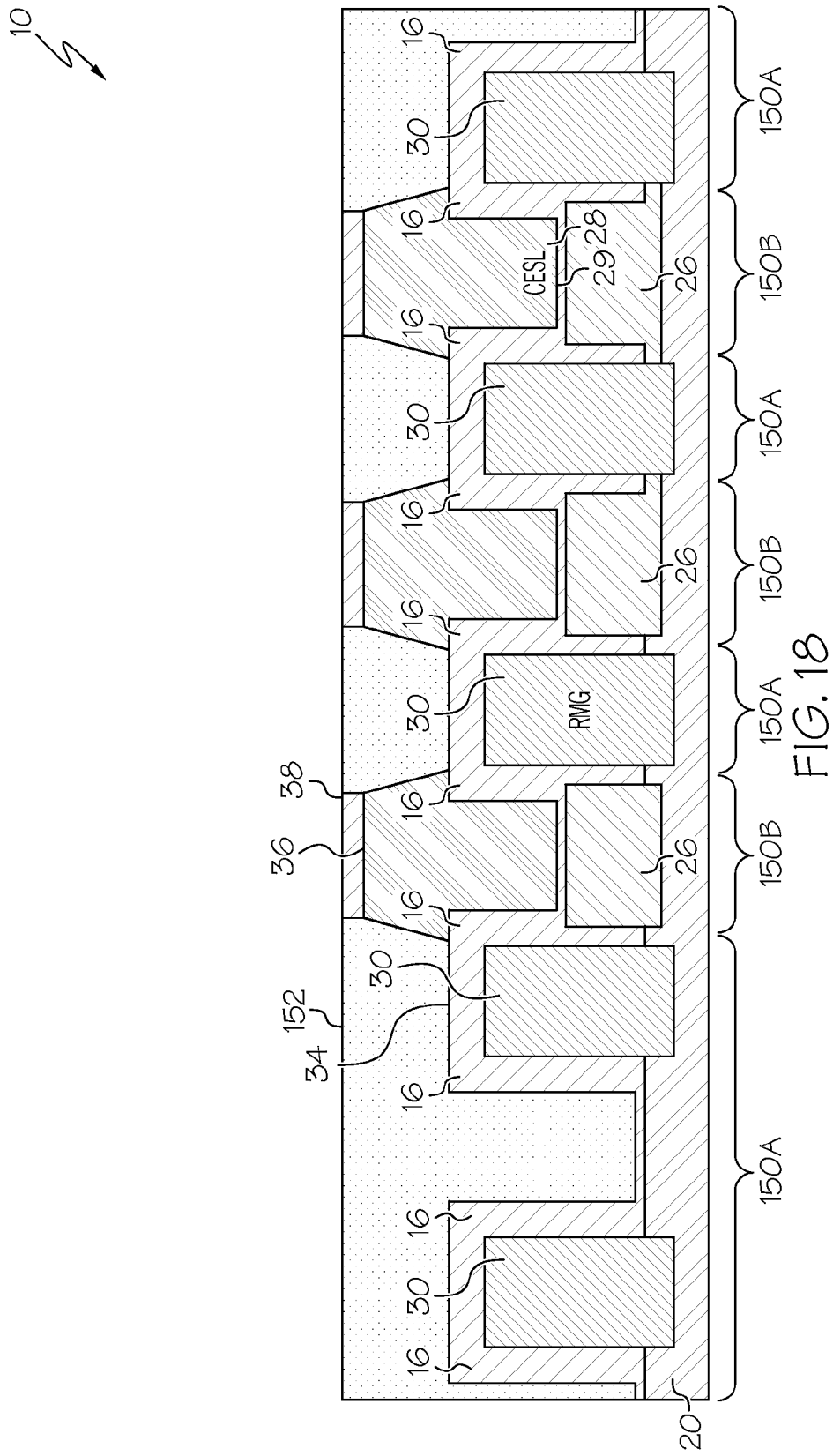
Figure 19:
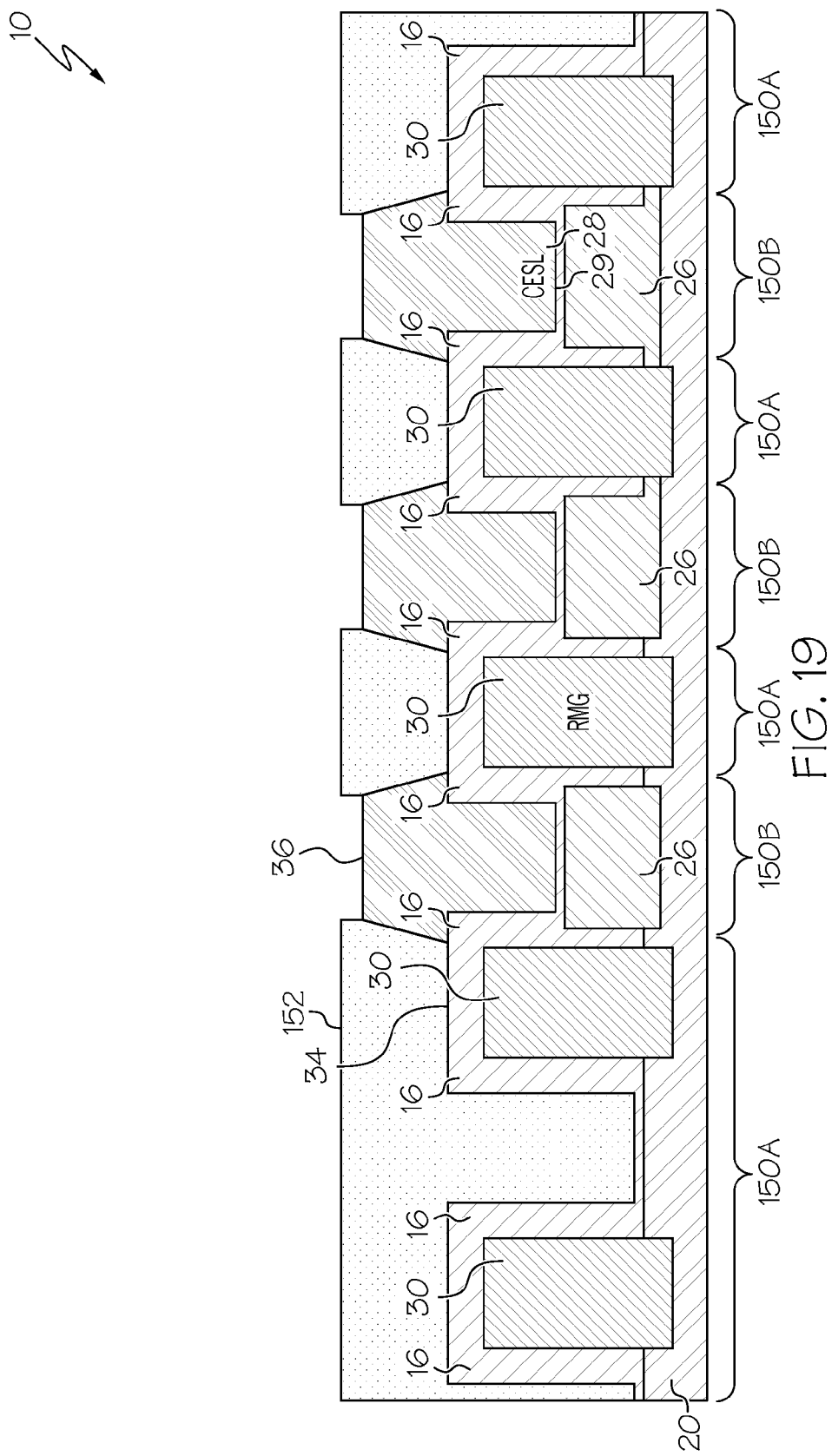
Figure 20:
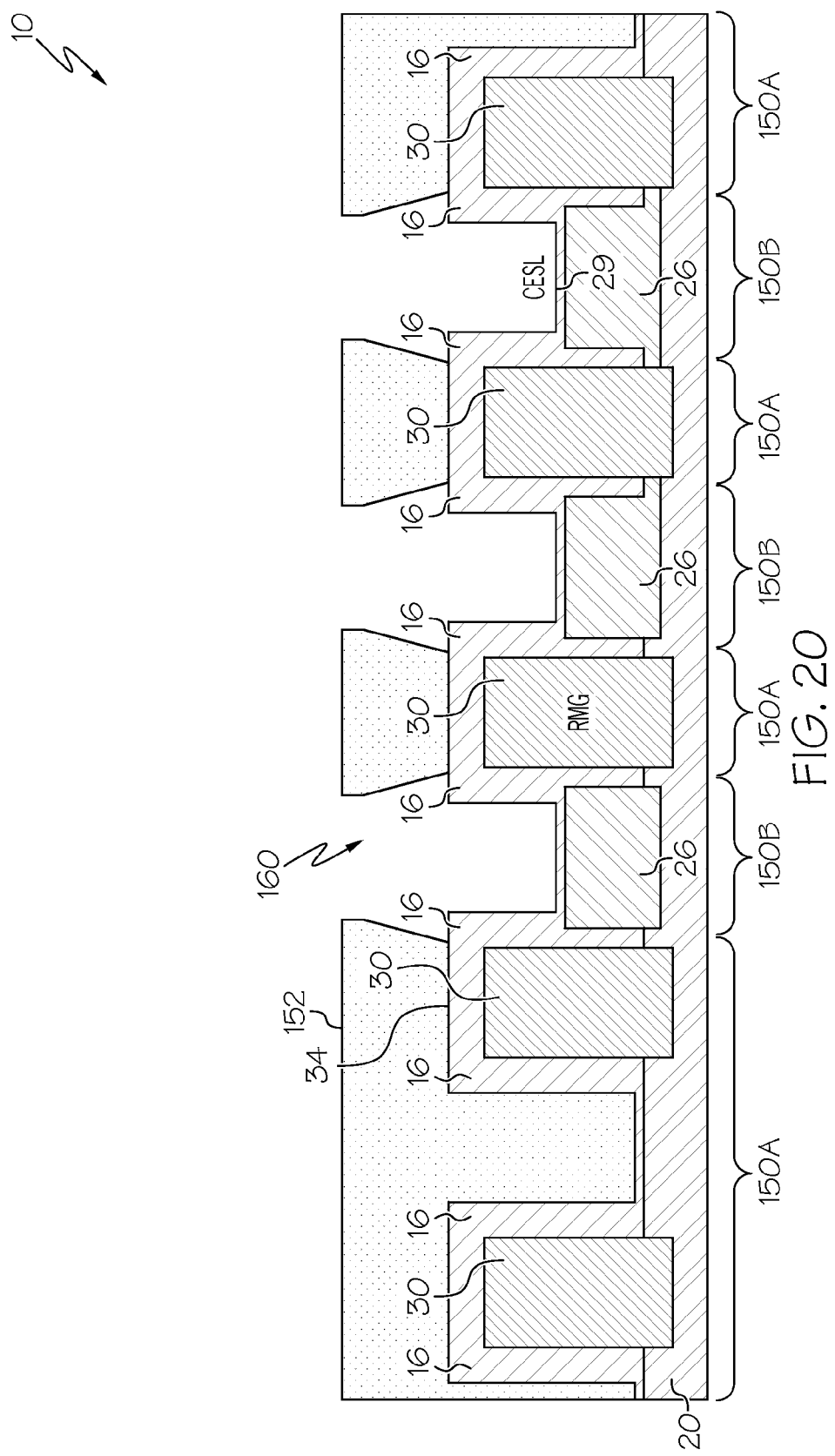
Figure 21:
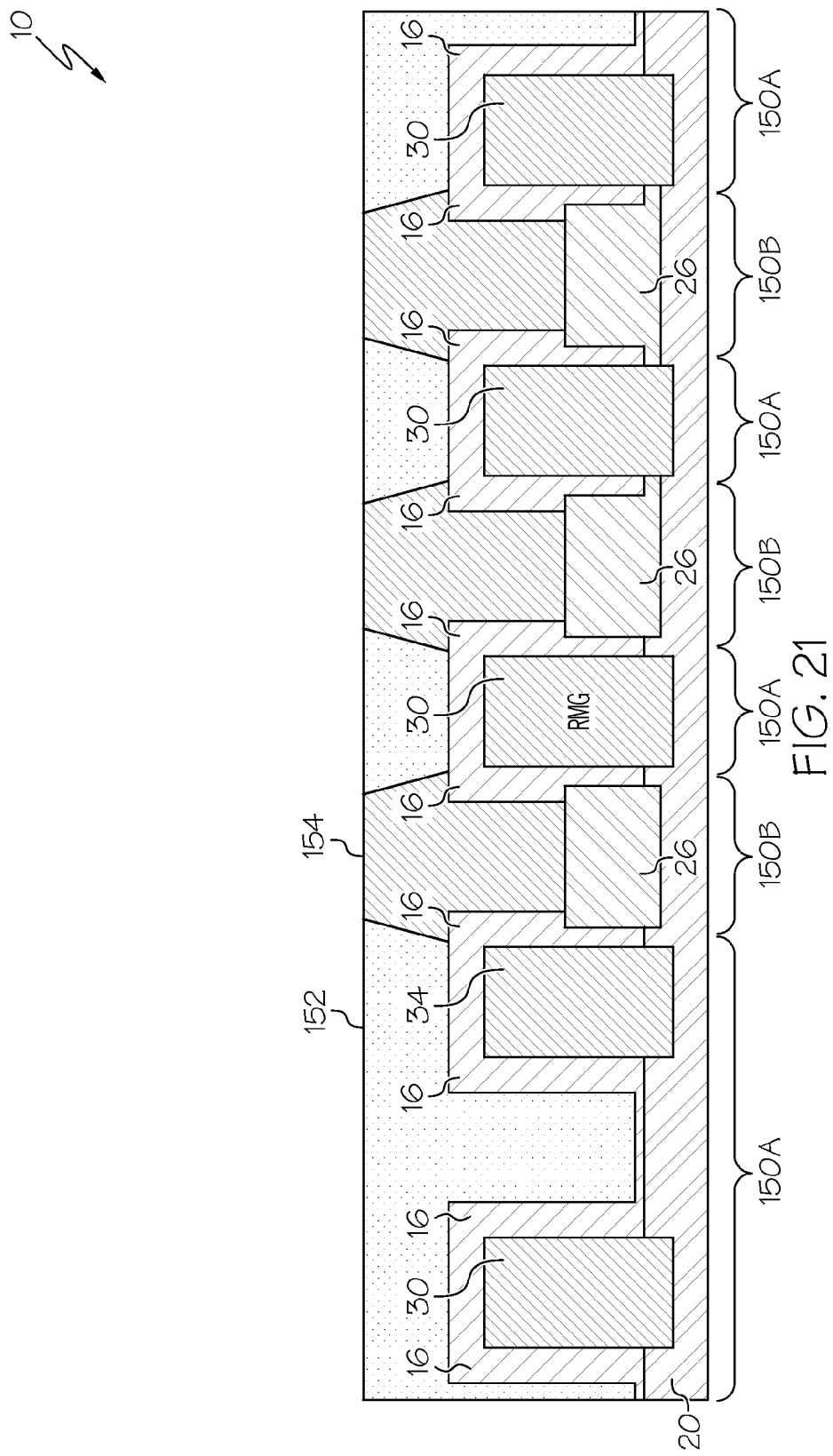

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings, in which:

FIG. 1 shows a semiconductor device according to an embodiment of the present invention;

FIG. 2 shows an alternative depiction of the semiconductor device of FIG. 1 according to an embodiment of the present invention;

FIG. 3 shows a recessing of a gate structure and a forming of a gate capping layer in the device of FIG. 2 according to an embodiment of the present invention;

FIG. 4 shows a forming of an oxide layer on the device of FIG. 3 according to an embodiment of the present invention;

FIG. 5 shows a forming of a nitride layer over the oxide layer on the device of FIG. 4 according to an embodiment of the present invention;

FIG. 6 shows a placement of a block mask on the device of FIG. 5 according to an embodiment of the present invention;

FIG. 7 shows a removing of the oxide layer from the portion of the device of FIG. 6 not covered by the block mask according to an embodiment of the present invention;

FIG. 8 shows a forming of an opposite-mask fill layer on the device of FIG. 7 according to an embodiment of the present invention;

FIG. 9 shows a polishing of the opposite-mask fill layer on the device of FIG. 8 according to an embodiment of the present invention;

FIG. 10 shows a removing of a remainder of the oxide layer on the device of FIG. 9 according to an embodiment of the present invention;

FIG. 11 shows a removing of a nitride liner layer from over the s/d contact location on the device of FIG. 10 according to an embodiment of the present invention;

FIG. 12 shows a forming of a metal contact layer on the device of FIG. 11 according to an embodiment of the present invention;

FIG. 13 shows a polishing of the metal contact layer on the device of FIG. 12 according to an embodiment of the present invention;

FIG. 14 shows a placement of a set of lithography stacks on the device of FIG. 13 according to an embodiment of the present invention;

FIG. 15 shows a removal of the nitride layer from the portion of the device of FIG. 14 not covered by the lithography stacks according to an embodiment of the present invention;

FIG. 16 shows a removal of the oxide layer from the portion of the device of FIG. 15 not previously covered by the lithography stacks according to an embodiment of the present invention;

FIG. 17 shows a forming of an opposite-mask fill layer on the device of FIG. 16 according to an embodiment of the present invention;

FIG. 18 shows a polishing of the opposite-mask fill layer on the device of FIG. 17 according to an embodiment of the present invention;

FIG. 19 shows a removing of a remainder of the nitride layer on the device of FIG. 18 according to an embodiment of the present invention;

FIG. 20 shows a removing of a remainder of the oxide layer on the device of FIG. 19 according to an embodiment of the present invention;

FIG. 21 shows a forming of a metal contact layer on the device of FIG. 19 according to an embodiment of the present invention;

DETAILED DESCRIPTION

It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art. The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure (e.g., a first layer), is present on a second element, such as a second structure (e.g., a second layer), wherein intervening elements, such as an interface structure (e.g., interface layer), may be present between the first element and the second element.

As used herein, "depositing" may include any now known or later developed techniques appropriate for the material to be deposited including, but not limited to, for example: chemical vapor deposition (CVD), low-pressure CVD (LPCVD), plasma-improved CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

As indicated above, embodiments of the present invention provide an improved semiconductor structure and methods of fabrication that provide improved transistor contacts in a semiconductor structure. A set of masks is formed over a portion of the semiconductor structure. Each mask in this set of masks covers at least one source/drain (s/d) contact location. An oxide layer is removed from remainder portions of the semiconductor structure that are not covered by the set of masks. Then an opposite-mask fill layer is formed in the remainder portions from which the oxide layer was removed. The oxide layer is then removed from the remainder of the semiconductor structure, i.e., the portion previously covered by the set of masks and contacts are formed to the at least s/d contact location in the recesses formed by the removal of the remainder of the oxide layer.

Referring now to FIG. 1, a cross-sectional view of a semiconductor device 10 according to an embodiment of the present invention is shown. As depicted, device 10 may include a set of gate stacks 12A-B formed over a substrate 20. Gate stacks 12A-B may include dummy gates 14A-B (e.g., polysilicon, SiOC, SiOCN, and/or the like), spacers 16, a gate dielectric 18, and/or a liner layer (not shown).

The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type of semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

As further shown, device 10 may include NFET region 22, PFET region 24, isolation region 23, raised source-drains (RSDs) 26A-D, which can include one or more phosphorus silicon (SiP) regions, one or more silicon germanium (SiGe) regions, and/or the like. It is understood that the specifying of portions of RSD 26A-D in accordance with use of certain materials (e.g., SiP and SiGe) should not be seen as limiting, but, rather, use of any materials now known or later developed as being adapted for use in RSDs 26A-D is envisioned. RSDs 26A-D, isolation region 23, and/or substrate 20 can also be covered by a liner layer 29, which can comprise a nitride. As further shown in FIG. 1, an inter-layer dielectric (ILD) 28 can also be deposited over semiconductor device 10 (e.g., over gate stacks 12A, 12B, RSDs 26A-D, etc.) and polished (e.g., via chemical-mechanical polishing (CMP)). It is understood that these layers/components are intended to be illustrative only and that other layers and/or materials may exist in device 10.

Referring now to FIG. 2, an alternative depiction of semiconductor structure 10 according to an embodiment of the invention is shown. As illustrated, dummy gates 14A-B (FIG. 1) have been removed from semiconductor device 10, and a set of gates 30 have be formed in forming gate region/areas in place of dummy gates (14A-B). These gates can be replacement metal gates and can be formed by depositing a series of gate material layers, which can include an oxide stack, including, but not limited to, Hafnium Oxide, covered by one or more work-function and/or field metal layers, which can include, but not be limited to: Ti, TiN, Ta, TaN, TiAl, Al, Cu, Co, TiC, W, and/or the like. Additionally or in the alternative, any other solution now known or later discovered can be utilized (e.g., a metal gate of a single uniform substance). Also, as shown, nitride liner layer 29 covers RSD areas 26 to which a contact needs to be established, as well as substrate 20 in areas where a contact does not need to be established.

Referring now to FIG. 3, a forming of a gate capping layer 36 in the semiconductor device 10 of FIG. 2 is shown according to an embodiment of the present invention. First, gates 30 are recessed. This recessing can be performed using a metal etch. Such a metal etch removes metal, such as that forming gate 30, without impacting nitrides, such as those that can be used to form spacers 16, or oxides, such as those that can be used to form ILD 28. Once gates 30 have been recessed, a capping substance can be deposited over semiconductor device 10 and planarized to form gate capping layers 34 over each of the recessed gates. In an embodiment, gate capping layers 34 have a composition (such as a nitride) that is different from that of ILD 28, but similar to that of spacers 16.

The inventors of the current invention have discovered that the prior art processes for forming and connecting contacts in a semiconductor device 10 suffer deficiencies as the form factor of the semiconductor device 10 decreases. Currently, these processes are done via a process called multiple-patterning. In this process, a series of lithographic overlay patterns are placed over the semiconductor device 10, after which an etch is performed with respect to each lithographic pattern. However, as the form factor of the semiconductor device 10 falls below 10 nm, more successive patterns are needed to form the structures, with triple-patterning or above being required. However, each lithography pattern that is used increases the time and cost to form the semiconductor device 10. Further, multiple lithography patterns must be correctly aligned for the device to perform correctly. This alignment becomes increasingly difficult as the form factor decreases and/or the lithography patterns become more complex, with adjacent tiny features requiring different color masks with stringent overlay requirements. Still further, the current solutions (e.g., reactive ion etch (RIE)) used to form the contact trenches can damage other structures in the semiconductor device 10 and/or can leave oxide residue in the contact area, potentially impacting semiconductor performance.

Referring now to FIG. 4, a forming of an oxide layer 36 in the semiconductor device 10 of FIG. 3 according to an embodiment of the present invention is shown. As illustrated, oxide layer 36 covers an entirety of the illustrated area of semiconductor device 10, including ILD 28, spacers 16, and capping layers 34. Then, as shown in FIG. 5, a nitride layer 38 is formed over oxide layer 36.

Referring now to FIGS. 6-21, a series of processes will be shown for making borderless contacts in semiconductor device 10. This series of processes utilizes an opposite polarity scheme for forming trenches to RSD regions 26. Specifically, rather than forming lithography masks such that openings in the lithography align with the RSD regions to which the contacts must be formed, in the present invention, lithography is formed over the contact regions and the remainder of semiconductor device 10 (e.g., that not covered by lithography) is stripped of oxide layer 36, leaving oxide over only the contact forming regions. The remainder is filled with a non-oxide opposite-mask fill, allowing the contact trenches to be formed by performing an oxide etch that is selective to the opposite-mask fill. The use of RIE to remove oxide can thus be limited to regions where contacts are not to be formed, reducing performance issues do to residual oxide. Further, the use of opposite polarity alleviates some of the difficultly in alignment in standard solutions as the form factor decreases and/or the lithography patterns become more complex. Specifics of this opposite polarity scheme can follow one of several embodiments, including but not limited to the following in which FIGS. 6-13 illustrate the use of a block mask and FIGS. 14-21 illustrate the use of individual lithography stacks. However, it should be understood that the embodiments can be combined (e.g., with both block mask and individual lithography stacks being used) to make contacts in a single semiconductor device.

Example Embodiment #1

Referring now to FIG. 6, a placement of a block mask 40 on semiconductor device 10 of FIG. 5 according to an embodiment of the present invention is shown. Block mask 40 is placed in such a way that it covers one or more s/d 26 contact location(s) (e.g., areas to which it is desired that contacts be formed), while leaving other "remainder portions" of semiconductor device 10 uncovered. Block mask 40 can include a trilayer mask, a softmask, and/or any other type of block mask now known or later developed. Further, block mask 40 can use RX, TS, and/or any other technique now known or later developed. In an embodiment, block mask 40 comprises a softmask, which can have a memorization layer, can have a better selectivity to oxide etch than a nitride hardmask, and/or can employ reused 14LPE CX patterning learning. As illustrated, block mask 40 is a soft mask which comprises an SiC layer 41, an SiON layer 42, a TEOS memorization layer 44, a BARC layer 46, and a photoresist layer 48. Such a block mask 40 can utilize an RX alignment (e.g., utilizing an FC layer), such as to PC or to the FIN. [Guillaume, could you please provide expansions for these acronyms?]

Referring now to FIG. 7, a removing of the oxide layer 38 from the portion of semiconductor device 10 of FIG. 6 not covered by block mask 40 (remainder portion 50A) according to an embodiment of the present invention is shown. This removal can be performed by performing a first etch to remove nitride layer 38 in remainder portion 50A. Then, block mask 40 can be removed, and oxide layer 36 can be removed from remainder portion 50A with an etch that is selective to nitride. In an embodiment, oxide layer 38 is removed using a RIE that is selective to nitride. In any case, the result is that nitride liner layer 29, capping layer 34, and spacers 16 are exposed in remainder portion 50A, while nitride layer 38 and oxide layer 36 remain in the portion (mask portion 50B) of semiconductor device 10 previously covered by block mask 40.

Referring now to FIG. 8, a forming of an opposite-mask fill layer 52 on semiconductor device 10 of FIG. 7 according to an embodiment of the present invention is shown. Opposite-mask fill layer 52 comprises a non-oxide substance, such that a subsequent removal of oxide can be performed using an etch that is selective to opposite-mask fill layer 52. In an embodiment, opposite-mask fill layer 52 is or comprises a silicon oxycarbide (SiOC) dielectric. In any case, opposite-mask fill layer 52 is deposited in remainder portions 50A of semiconductor structure 10 such that remainder portions 50A are completely covered by opposite-mask fill layer 52. As illustrated, opposite-mask fill layer 52 can also cover all or portions of nitride layer 38 in mask portion 50B.

Referring now to FIG. 9, a polishing of the opposite-mask fill layer 52 on semiconductor device 10 of FIG. 8 is shown according to an embodiment of the present invention. This polishing of opposite-mask fill layer 52 can be performed via CMP polishing process or any other suitable process. In any case, the polishing can remove any of opposite-mask fill layer 52 present in mask portion 50B. In addition, the polishing can remove what is left of nitride layer 38 in mask portion 50B or, alternatively, what is left of nitride layer 38 can be removed via a separate process. What results is opposite-mask fill layer 52 covering semiconductor device 10 in remainder region 50A and oxide layer 50B covering semiconductor device 10 in mask region 50B.

Referring now to FIG. 10, a removing of a remainder of the oxide layer 36 from the device of FIG. 9 according to an embodiment of the present invention is shown. Oxide layer 36 can be removed via an etching process that is selective to both opposite-mask fill layer 52 and nitride, preserving nitride liner layer 29, capping layer 34, and spacers 16. For example, in an embodiment, oxide layer 36 is removed using a dHF wet process. Alternatively, hot phos and dHF processes could be integrated in a single wet process. Then, nitride liner layer 29 can be removed from over RSD 26, as shown in FIG. 11. This removal is preferably performed using a process that is selective to doped Fins, Si, and/or SiGe material forming RSD 26. To this extent, nitride liner layer can be removed using an anisotropic pulse-based reactive ion etch (RIE) in an etcher, an isotropic SiCoNi-like removal in AMAT frontier tool, and/or the like. Note that although, as illustrated, removal of nitride liner layer 29 may remove a portion of capping layer 34 and spacers 16, capping layer 34 is of sufficient thickness to protect gate 30 from being exposed. In any case, what results is RSD 26 being exposed and having ready-made, self-aligned channels for forming contacts.

Referring now to FIG. 12, a forming of a metal contact layer 54 on the device of FIG. 11 according to an embodiment of the present invention is shown. As discussed, borderless, self-aligned channels have already been formed. As such, the remainder of the contact can be formed by the depositing of contact layer 54 that does not require small scale lithography. To this extent, contact layer 54 can be deposited over an entirety of a region (e.g., mask portion 50B) of semiconductor device 10. Contact layer 54 can be formed from a contact metal, which could include tungsten, copper, cobalt, and/or any other metal now known or later developed for forming s/d contacts and/or can be used in conjunction with a liner (e.g., TiN). Then, as shown in FIG. 13, contact layer 54 can be planarized and/or large-scale lithography can be performed to form the final contacts.

Example Embodiment #2

Referring now to FIG. 14, a placement of a set of CA lithography stacks 140 on semiconductor device 10 of FIG. 5 according to an embodiment of the present invention is shown. Each CA lithography stack 140 is individually placed in such a way that each s/d 26 contact location (e.g., areas to which it is desired that contacts be formed) is covered by a single one of the CA lithography stacks 140, while leaving other "remainder portions" of semiconductor device 10 uncovered. To this extent, CA lithography stacks 140 can include [Guillaume, are there some specific examples we can put in here?], and/or any other type of combination of layers now known or later developed for performing lithography. Further, CA lithography stacks 140 can use RX, TS, and/or any other technique now known or later developed. [Is this still correct?] These CA lithography stacks 140 can utilize an RX alignment (e.g., utilizing an FC layer), such as to PC or to the FIN. [Guillaume, could you please provide expansions for these acronyms?]

Referring now to FIG. 15, a removing of the nitride layer 38 from the portion of semiconductor device 10 of FIG. 14 not covered by CA lithography stacks 140 (remainder portion 150A) according to an embodiment of the present invention is shown. This removal can be performed by performing an etch (e.g., a reactive ion etch) to remove nitride layer 38 in remainder portion 150A. In an embodiment, the etch used to remove nitride layer 38 can include a reactive ion etch that is selective to oxide. Then, CA lithography stacks 140 can be removed using any known or later discovered process. This results is that oxide layer 36, being exposed in remainder portion 150A, while nitride layer 38 remains in the portion (mask portion 150B) of semiconductor device 10 previously covered by CA lithography stacks 140.

Referring now to FIG. 16, a removing of the oxide layer 38 from the portion of semiconductor device 10 of FIG. 15 not covered by nitride layer 38 (remainder portion 150A) according to an embodiment of the present invention is shown. Oxide layer 36 can be removed from remainder portion 150A with an etch that is selective to nitride. In an embodiment, oxide layer 38 is removed using a RIE that is selective to nitride. In any case, the result is that nitride liner layer 29, capping layer 34, and spacers 16 are exposed in remainder portion 150A, while nitride layer 38 and oxide layer 36 remain in the portion (mask portion 150B) of semiconductor device 10 previously covered by CA lithography stacks 140.

Referring now to FIG. 17, a forming of an opposite-mask fill layer 52 on semiconductor device 10 of FIG. 16 according to an embodiment of the present invention is shown. Opposite-mask fill layer 52 comprises a non-oxide substance, such that a subsequent removal of oxide can be performed using an etch that is selective to opposite-mask fill layer 52. In an embodiment, opposite-mask fill layer 52 is or comprises a silicon oxycarbide dielectric. In any case, opposite-mask fill layer 52 is deposited in remainder portions 150A of semiconductor structure 10 such that remainder portions 150A are completely covered by opposite-mask fill layer 52. As illustrated, opposite-mask fill layer 52 can also cover all or portions of nitride layer 38 in mask portion 150B.

Referring now to FIG. 18, a polishing of the opposite-mask fill layer 52 on semiconductor device 10 of FIG. 17 is shown according to an embodiment of the present invention. This polishing of opposite-mask fill layer 52 can be performed via CMP polishing process or any other suitable process. In any case, the polishing can remove any of opposite-mask fill layer 52 present in mask portion 150B. Then, as shown in FIG. 19, what is left of nitride layer 38 in mask portion 150B can be removed. Nitride layer 38 can be removed with a RIE, a wet etch, and/or utilizing any solution now known or later developed. What results is opposite-mask fill layer 52 covering semiconductor device 10 in remainder region(s) 150A and oxide layer 150B covering semiconductor device 10 in mask region(s) 150B.

Referring now to FIG. 20, a removing of a remainder of the oxide layer 36 from the device of FIG. 19 according to an embodiment of the present invention is shown. Oxide layer 36 can be removed via an etching process that is selective to both opposite-mask fill layer 52 and nitride, preserving nitride liner layer 29, capping layer 34, and spacers 16. For example, in an embodiment, oxide layer 36 is removed using a dHF wet process. Alternatively, hot phos and dHF processes could be integrated in a single wet process. Then, nitride liner layer 29 can be removed from over RSD 26 (not shown). This removal is preferably performed using a process that is selective to doped Fins, Si, and/or SiGe material forming RSD 26. To this extent, nitride liner layer can be removed using an anisotropic pulse-based reactive ion etch (RIE) in an etcher, an isotropic SiCoNi-like removal in AMAT frontier tool, and/or the like. Note that although, as illustrated, etch may remove a portion of capping layer 34 and spacers 16 as well as nitride liner layer 29, capping layer 34 is of sufficient thickness to protect gate 30 from being exposed. In any case, what results is RSD 26 being exposed and having ready-made, self-aligned channels for forming contacts.

Referring now to FIG. 21, a forming of a metal contact layer 54 on the device of FIG. 20 according to an embodiment of the present invention is shown. As discussed, borderless, self-aligned channels have already been formed. As such, the remainder of the contact can be formed by the depositing of contact layer 54 that does not require small scale lithography. To this extent, contact layer 54 can be deposited over an entirety of a region (e.g., mask portion 150B) of semiconductor device 10. Then, contact layer 54 can be planarized and/or large-scale lithography can be performed to form the final contacts. Contact layer 54 can be formed from a contact metal, which could include tungsten, copper, cobalt, and/or any other metal now known or later developed for forming s/d contacts and/or can be used in conjunction with a liner (e.g., TiN).

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method of forming a set of contacts in a semiconductor structure comprising:
    forming a set of masks over a portion of the semiconductor structure, wherein each mask in the set of masks covers at least one source/drain (s/d) contact location;
    removing a oxide layer from remainder portions of the semiconductor structure that are not covered by the set of masks;
    removing the set of masks from the entire semiconductor structure;
    forming an opposite-mask fill layer in the remainder portions of the semiconductor structure;
    removing the oxide layer from the portion of the semiconductor structure previously covered by the set of masks; and
    depositing a metal contact layer that forms a contact to the at least one s/d contact location in the portion of the semiconductor structure previously covered by the set of masks.

2. The method of claim 1, wherein the set of masks comprises a block mask.

3. The method of claim 2,
    wherein the block mask comprises a softmask, and
    wherein the softmask comprises an SiC layer, an SiON layer, a TEOS memorization layer, a BARC layer, and a photoresist layer.

4. The method of claim 1, wherein the set of masks comprises a separate lithography stack over each s/d contact location.

5. The method of claim 1, further comprising:
    forming, prior to the forming of the set of masks, the oxide layer covering the semiconductor structure;
    forming a nitride layer over the oxide layer;
    removing the nitride layer from all areas of the semiconductor structure not covered by the set of masks; and
    performing an etch selective to nitride to perform the removing of the oxide layer in the remainder portions of the semiconductor structure not covered by the nitride layer.

6. The method of claim 5, further comprising:
    performing the forming of the opposite-mask fill layer by depositing a silicon oxycarbide dielectric in the remainder portions of the semiconductor structure;
    removing the nitride layer from the portion of the semiconductor structure previously covered by the set of masks;
    removing a nitride liner layer from over the s/d contact location prior to the depositing of the metal contact layer; and
    wherein performing the etch selective to nitride comprises performing a strip that is selective to the silicon oxycarbide dielectric to perform the removing of the oxide layer from the portion of the semiconductor structure previously covered by the set of masks.

7. The method of claim 6, further comprising:
    forming, prior to the forming of the oxide layer, a set of gate capping regions covering a set of gates in the semiconductor structure,
    wherein the set of gate capping regions comprise a nitride, and
    wherein the set of gate capping regions protect a material forming the set of gates during the removing of the oxide layer from the remainder portions of the semiconductor structure that are not covered by the set of masks and during the removing of the oxide layer from the portion of the semiconductor structure previously covered by the set of masks.

8. The method of claim 7, wherein the set of gates comprise replacement metal gates (RMG) in a RMG transistor.

9. A method of forming a semiconductor device comprising:
   forming a set of source-drain (s/d) regions and a set of replacement metal gates on a substrate;
   forming a set of gate capping regions over the set of replacement metal gates;
   forming an oxide layer over the semiconductor device;
   forming a set of masks over a portion of the semiconductor device, wherein each mask in the set of masks covers at least one source/drain (s/d) contact location;
   removing the oxide layer from remainder portions of the semiconductor device that are not covered by the set of masks;
   removing the set of masks from the entire semiconductor structure;
   forming a silicon oxycarbide dielectric layer in the remainder portions of the semiconductor device;
   removing the oxide layer from the portion of the semiconductor device previously covered by the set of masks; and
   depositing a metal contact layer that forms a contact to the at least one s/d contact location in the portion of the semiconductor device previously covered by the set of masks.

10. The method of claim 9,
   wherein the set of masks comprises a block mask,
   wherein the block mask comprises a softmask, and
   wherein the softmask comprises an SiC layer, an SiON layer, a TEOS memorization layer, a BARC layer, and a photoresist layer.

11. The method of claim 9, wherein the set of masks comprises a separate lithography stack over each s/d contact location.

12. The method of claim 9, further comprising:
   forming, prior to the forming of the set of masks, a nitride layer covering the oxide layer;
   removing the nitride layer from all areas of the semiconductor structure not covered by the set of masks; and
   performing an etch selective to nitride to perform the removing of the oxide layer in the remainder portions of the semiconductor structure not covered by the nitride layer.

13. The method of claim 12, further comprising:
   removing the nitride layer from the portion of the semiconductor structure previously covered by the set of masks;
   removing a nitride liner layer from over the s/d contact location prior to the depositing of the metal contact layer; and
   wherein performing the etch selective to nitride comprises performing a strip that is selective to the silicon oxycarbide dielectric to perform the removing of the oxide layer from the portion of the semiconductor structure previously covered by the set of masks.

14. The method of claim 13,
   wherein the set of gate capping regions comprise a nitride, and
   wherein the set of gate capping regions protect a material forming the set of gates during the removing of the oxide layer from the remainder portions of the semiconductor structure that are not covered by the set of masks and during the removing of the oxide layer from the portion of the semiconductor structure previously covered by the set of masks.

* * * * *